(12) United States Patent
Torai et al.

(10) Patent No.: US 9,194,900 B2
(45) Date of Patent: Nov. 24, 2015

(54) ELECTRODE EVALUATION APPARATUS AND ELECTRODE EVALUATION METHOD

(71) Applicant: YOKOGAWA ELECTRIC CORPORATION, Musashino-shi, Tokyo (JP)

(72) Inventors: Souichirou Torai, Musashino (JP); Daisuke Yamazaki, Musashino (JP); Nobuhiro Tomosada, Musashino (JP); Tomomi Akutsu, Musashino (JP); Makoto Kawano, Musashino (JP); Tetsuo Yano, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 194 days.

(21) Appl. No.: 13/760,417

(22) Filed: Feb. 6, 2013

(65) Prior Publication Data

US 2013/0207671 A1    Aug. 15, 2013

(30) Foreign Application Priority Data

Feb. 10, 2012   (JP) .................................. 2012-027464

(51) Int. Cl.
*G01R 31/36* (2006.01)
*G01R 27/02* (2006.01)
*H01M 10/42* (2006.01)

(52) U.S. Cl.
CPC ............ *G01R 27/02* (2013.01); *G01R 31/3662* (2013.01); *H01M 10/42* (2013.01)

(58) Field of Classification Search
USPC ........ 324/698, 694, 629, 71.1, 601, 600, 679, 324/713, 649, 438; 435/285.2; 422/82.01, 422/82.02, 53; 205/727, 730, 775.5, 790, 205/401, 404; 600/547, 345, 361, 372
See application file for complete search history.

(56) References Cited

U.S. PATENT DOCUMENTS

| 5,518,590 | A * | 5/1996 | Fang .......................... 205/780.5 |
| 7,842,174 | B2 * | 11/2010 | Zhou et al. ..................... 204/406 |
| 2008/0042665 | A1 * | 2/2008 | Rezvani et al. ............... 324/713 |
| 2010/0032319 | A1 * | 2/2010 | Okada et al. .................. 205/787 |
| 2010/0151341 | A1 |  6/2010 | Manabe et al. |

(Continued)

FOREIGN PATENT DOCUMENTS

| CN | 101682064 A | 3/2010 |
| JP | 2009-048813 A | 3/2009 |

(Continued)

*Primary Examiner* — Melissa Koval
*Assistant Examiner* — Nasima Monsur
(74) *Attorney, Agent, or Firm* — Hauptman Ham, LLP

(57) ABSTRACT

An electrode evaluation apparatus for evaluating a characteristic of an electrode based on an electrochemical property includes a potential control unit, an impedance acquiring unit, a current value acquiring unit, and a normalized impedance calculation unit. The potential control unit is configured to control a potential applied to an electrode. The impedance acquiring unit is configured to acquire an impedance characteristic of the electrode under a specific DC operating condition provided by the potential control unit. The current value acquiring unit is configured to acquire a temporal change in direct current value under the specific DC operating condition. The normalized impedance calculation unit is configured to apply the temporal change in direct current value acquired by the current value acquiring unit to calculate a normalized impedance where impedance acquired by the impedance acquiring unit is multiplied by the direct current value.

19 Claims, 23 Drawing Sheets

(56) References Cited

U.S. PATENT DOCUMENTS

2010/0184115 A1\* 7/2010 Lei et al. .......................... 435/29
2011/0014633 A1\* 1/2011 Ifuku et al. ..................... 435/7.9

FOREIGN PATENT DOCUMENTS

| JP | 2009-048814 A | 3/2009 |
| JP | 2012-003922 A | 1/2012 |

\* cited by examiner

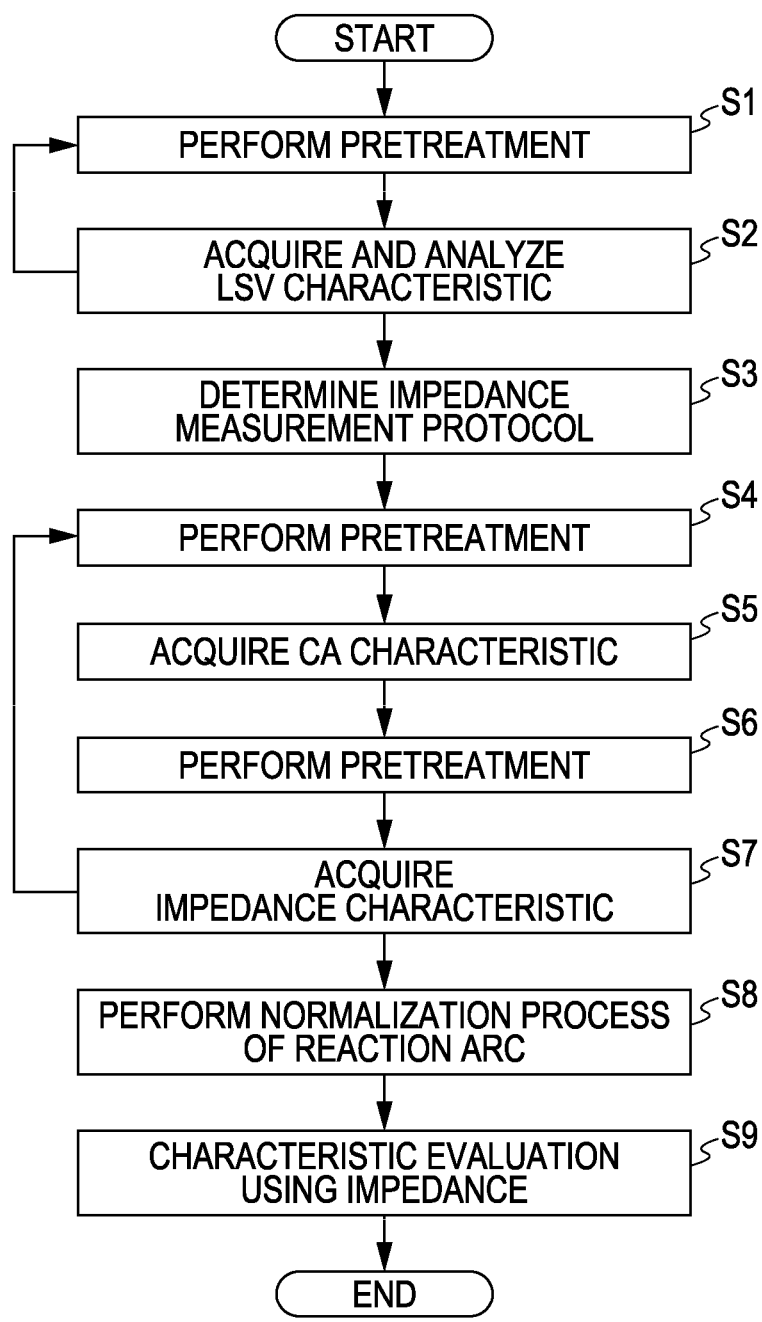

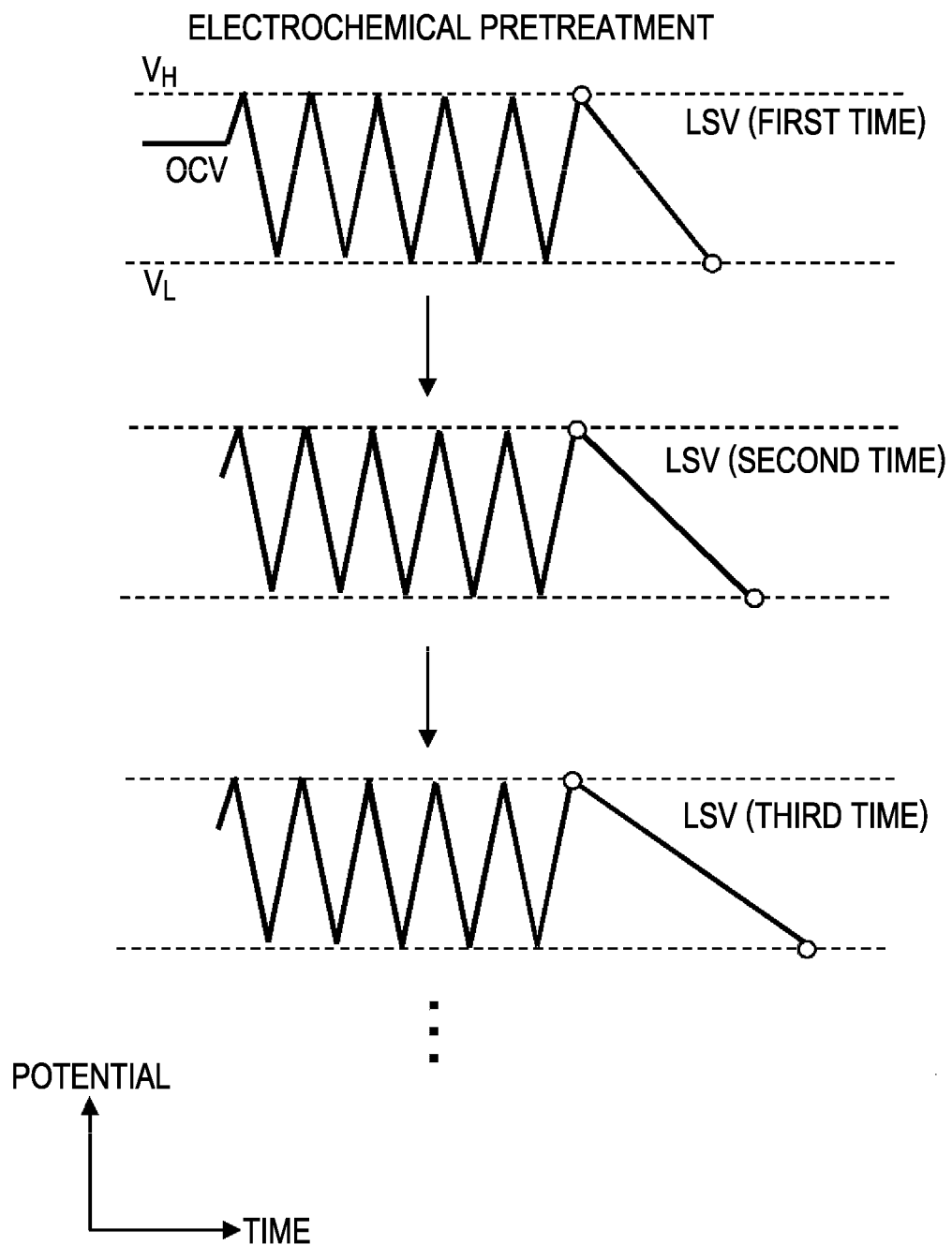

FIG. 13A

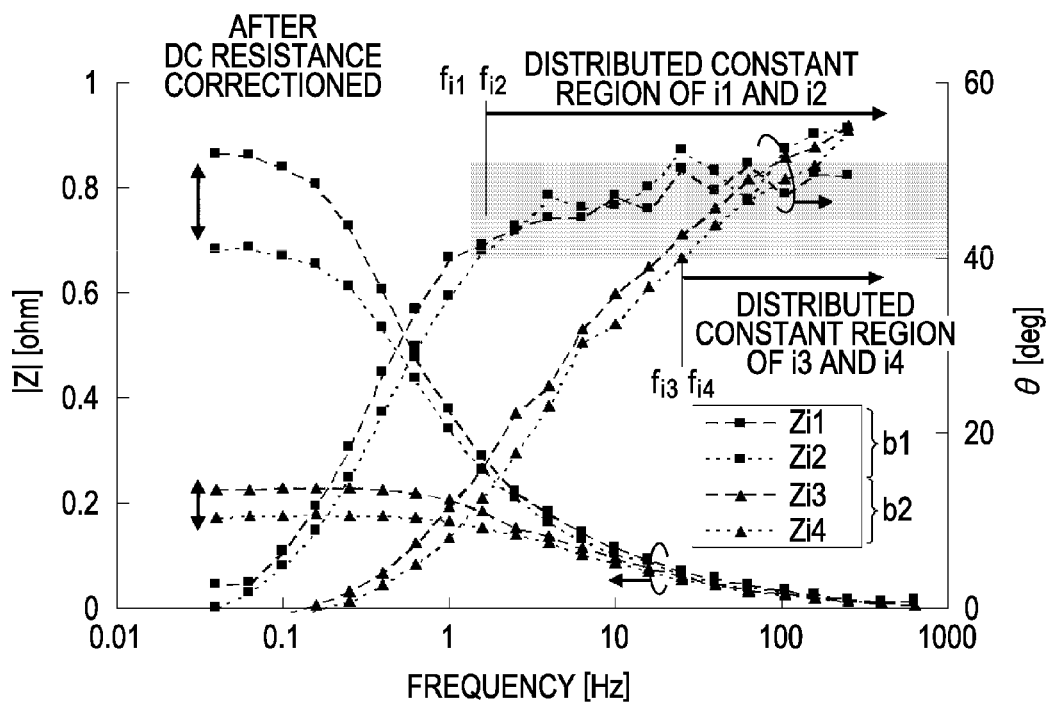

FIG. 13B

TRANSITION FREQUENCY $f_t$ $\quad f_t = \dfrac{3}{2\pi R_{ion} C_{dl}}$ $\quad$ ···eq.1

IMPEDANCE $Z'$ $\quad Z'_{high} = \dfrac{1}{\sqrt{\omega}} \sqrt{\dfrac{R_{ion}}{2C_{dl}}}$ $\quad$ ···eq.2

IMPEDANCE $Z''$ $\quad Z''_{high} = \dfrac{1}{\sqrt{\omega}} \sqrt{\dfrac{R_{ion}}{2C_{dl}}}$ $\quad$ ···eq.3

NOTE THAT
$R_{ion}$: PROTON TRANSFER RESISTANCE OF CATALYST LAYER
$C_{dl}$: ELECTRICAL DOUBLE-LAYER CAPACITANCE

FIG. 18

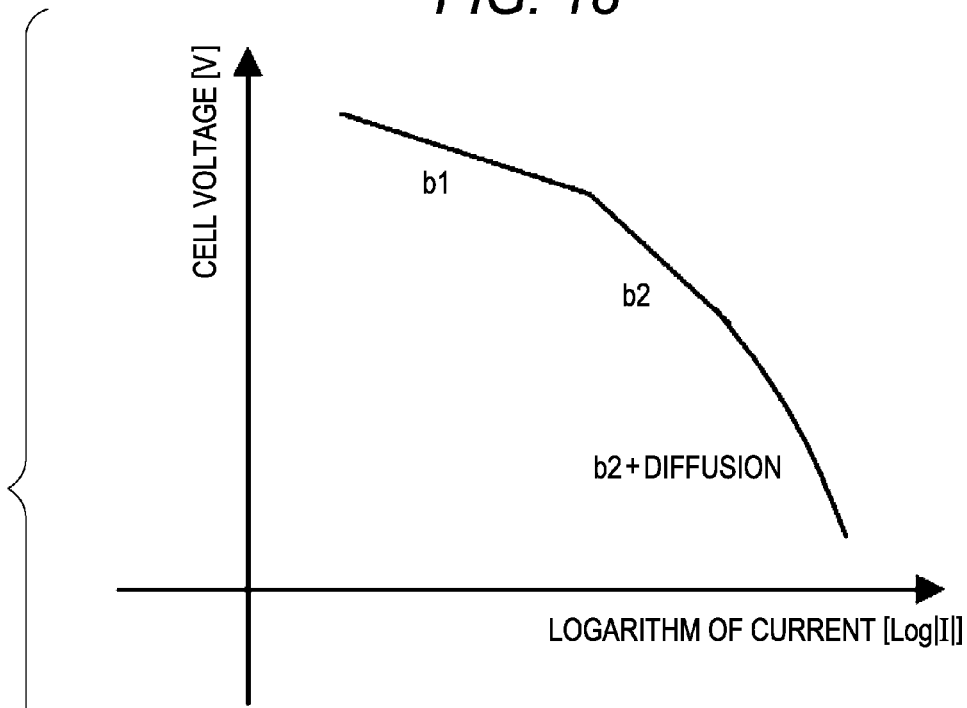

$$i = i_0\left(1 - \frac{i}{i_L}\right)\exp\left(-\frac{\alpha nF}{RT}\eta\right) \qquad \cdots \text{eq.11}$$

$$\eta = -\frac{2.3RT}{\alpha nF}\log\frac{i_L}{i_0} - \frac{2.3RT}{\alpha nF}\log\left(\frac{i}{i_L - i}\right)$$
$$= k - \frac{2.3RT}{\alpha nF}\log\left(\frac{i}{i_L - i}\right) \qquad (k = \text{const}) \qquad \cdots \text{eq.12}$$

$$i\frac{d\eta}{di} = iZ = -i \cdot \frac{2.3RT}{\alpha nF}\left\{\frac{i_L - i}{i} \cdot \frac{d}{di}\left(\frac{i}{i_L - i}\right)\right\}$$
$$= -\frac{2.3RT}{\alpha nF} \cdot \frac{i_L}{i_L - i}$$
$$\approx -\left[\frac{2.3RT}{\alpha nF} + \frac{2.3RT}{\alpha nF i_L} \cdot i\right] \quad (\text{WHEN } i_L \text{ IS SUFFICIENTLY LARGE}) \quad \cdots \text{eq.13}$$

$(iZ_{(f)})_{c.x}' = (iZ_{(f)})_{c.x} - C_{(f)} \cdot (i_x - i_{c.0})$ (NOTE THAT x IS ANY OPERATING POINTS IN DIFFUSION REGION) ···eq.15

US 9,194,900 B2

ELECTRODE EVALUATION APPARATUS AND ELECTRODE EVALUATION METHOD

CROSS-REFERENCE TO RELATED APPLICATION

This application is based on Japanese Patent Application No. 2012-027464 filed on Feb. 10, 2012 with the Japan Patent Office, the entire content of which is hereby incorporated by reference.

BACKGROUND

1. Technical Field

The disclosure relates to an electrode evaluation apparatus and a similar apparatus that evaluates a characteristic of an electrode based on an electrochemical property. Especially, the disclosure relates to an electrode evaluation apparatus and a similar apparatus that allow accurate impedance evaluation.

2. Related Art

An electrode reaction in a fuel cell and a similar cell generally proceeds through processes of: (1) material transport (diffusion) to an electrode surface of a reactant; and (2) charge-transfer reaction with a catalyst on the electrode surface. It is significantly important to know how dominant each process is in the electrode reaction when evaluating a characteristic of an electrode, a cause of performance degradation, and a similar phenomenon. A method for this purpose employs evaluation using a direct current (DC) characteristic and impedance (see JP-A-2012-3922, JP-A-2009-48814, and JP-A-2009-48813).

SUMMARY

An electrode evaluation apparatus according to the disclosure evaluates a characteristic of an electrode based on an electrochemical property. The electrode evaluation apparatus includes a potential control unit, an impedance acquiring unit, a current value acquiring unit, and a normalized impedance calculation unit. The potential control unit is configured to control a potential applied to an electrode. The impedance acquiring unit is configured to acquire an impedance characteristic of the electrode under a specific DC operating condition provided by the potential control unit. The current value acquiring unit is configured to acquire a temporal change in direct current value under the specific DC operating condition. The normalized impedance calculation unit is configured to apply the temporal change in direct current value acquired by the current value acquiring unit to calculate a normalized impedance where impedance acquired by the impedance acquiring unit is multiplied by the direct current value.

BRIEF DESCRIPTION OF THE DRAWINGS

FIG. 2 is a flowchart illustrating operations of a control operation device;

FIG. 3 is a diagram illustrating potential controls in an electrochemical pretreatment (step S1) and LSV characteristic measurement (step S2);

FIG. 4A is a graph where a vertical axis indicates a current value, and FIG. 4B is a graph where a vertical axis indicates the logarithm of a current value;

FIG. 7A is a graph illustrating impedance characteristics (a Cole-Cole plot) for respective measurement potentials (V1, V2, . . . , and Vx), and FIG. 7B is a graph illustrating normalized impedance (if×Z) characteristics derived from catalytic reactions obtained by multiplying impedance illustrated in FIG. 7A by a DC current value if for each frequency;

FIGS. 13A and 13B are respectively a graph and equations illustrating a |Z|-f characteristic and a θ-f characteristic of impedance (after DC resistance correction) illustrated in FIGS. 4A and 4B;

FIG. 18 is a graph illustrating a Tafel plot measured to a diffusion region;

FIG. 19A is a graph illustrating a current-Tafel slope characteristic, and FIG. 19B is a graph illustrating a logarithm of current-Tafel slope characteristic;

DETAILED DESCRIPTION

Figure 1:
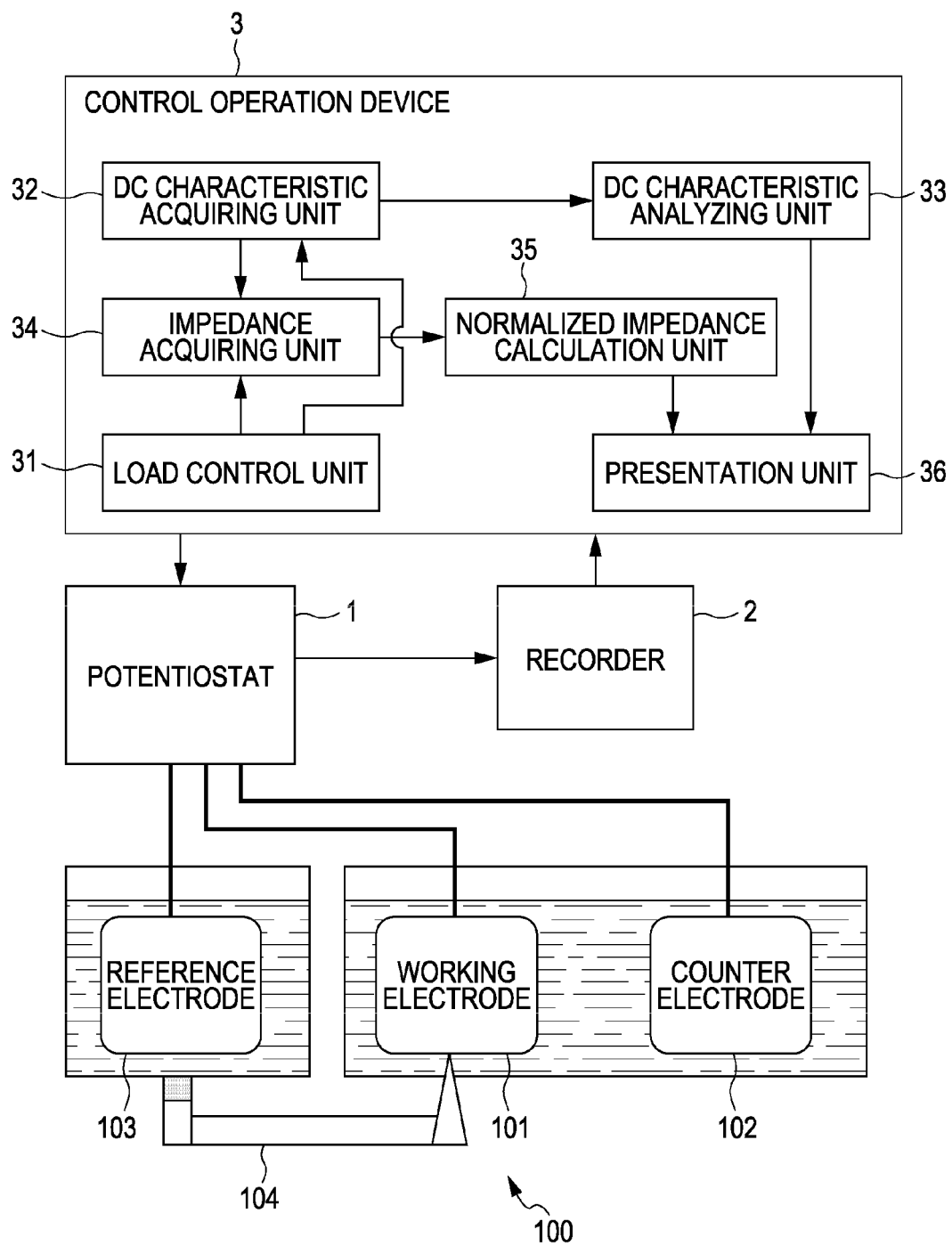
FIG. 1 is a block diagram functionally illustrating an electrode evaluation method.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Pt (platinum), which is a common catalyst for a fuel cell, is known as a pure material that is stable and has high oxygen reduction activity in an acidic electrolyte. However, it is generally known that quantity and quality of a surface oxide is varied by a potential history, and oxide generation on the surface and surface adsorption of organic matter and the like significantly affect the catalyst activation. Therefore, if measurement is started in a state with a potential history, a surface condition of Pt varies due to the history. Thus, the DC characteristic and the impedance characteristic become irreproducible. Some potential temporally advances oxide generation, and adsorption of anion, organic matter, and similar matter. Accordingly, the catalyst activation (a direct current value) changes every second. Thus, an evaluation result of the catalyst activation significantly differs by a measurement condition and the like. An international evaluation standard is not yet clearly set due to its difficulty. For this reason, it is preferred to cancel the potential history when impedance is evaluated and additionally consider a temporal change in catalyst activation during the measurement.

An object of the disclosure is to provide an electrode evaluation apparatus and a similar apparatus that allow accurate impedance evaluation.

An electrode evaluation apparatus according to the disclosure evaluates a characteristic of an electrode based on an electrochemical property. The electrode evaluation apparatus includes a potential control unit, an impedance acquiring unit, a current value acquiring unit, and a normalized impedance calculation unit. The potential control unit is configured to control a potential applied to an electrode. The impedance acquiring unit is configured to acquire an impedance characteristic of the electrode under a specific DC operating condition provided by the potential control unit. The current value acquiring unit is configured to acquire a temporal change in direct current value under the specific DC operating condition. The normalized impedance calculation unit is configured to apply the temporal change in direct current value acquired by the current value acquiring unit to calculate a normalized impedance where impedance acquired by the impedance acquiring unit is multiplied by the direct current value.

This electrode evaluation apparatus applies the temporal change in direct current value acquired by the current value acquiring unit to calculate a normalized impedance where impedance acquired by the impedance acquiring unit is multiplied by the direct current value. Therefore, it is possible to obtain an accurate normalized impedance.

The current value acquiring unit may acquire the temporal change in direct current value based on controlled direct current from a potentiostat during chrono amperometry under the specific DC operating condition or during acquisition of the impedance characteristic by the impedance acquiring unit, the potentiostat being coupled to the electrode.

The potential control unit may sequentially perform: a process of repeating a fast sweep prior to transition to the specific DC operating condition; a process of controlling a potential until satisfying the specific DC operating condition; and a process of maintaining a potential and waiting to release a background current.

The electrode evaluation apparatus may further include a sweep rate determining unit configured to determine a sweep rate to reach the specific DC operating condition by performing measurement by linear sweep voltammetry for a plurality of sweep rates immediately after a fast sweep, and the potential control unit may control a potential at the sweep rate determined by the sweep rate determining unit until the specific DC operating condition is satisfied.

The sweep rate determining unit may determine a slowest sweep rate to obtain a steady state among the plurality of sweep rates as the sweep rate to reach the specific DC operating condition.

The electrode evaluation apparatus may further include an evaluating unit configured to evaluate surface adsorption under the specific DC operating condition by performing cyclic voltammetry before and after the specific DC operating condition, and by comparing waveforms before and after the cyclic voltammetry.

An electrode evaluation method according to the disclosure evaluates a characteristic of an electrode based on an electrochemical property, the electrode evaluation method including: controlling a potential applied to an electrode; acquiring an impedance characteristic of the electrode under a specific DC operating condition provided by the potential control; acquiring a temporal change in direct current value under the specific DC operating condition; and applying the acquired temporal change in direct current value to calculate a normalized impedance where the acquired impedance is multiplied by the direct current value.

This electrode evaluation method applies the acquired temporal change in direct current value to calculate a normalized impedance where the acquired impedance is multiplied by the direct current value. Therefore, it is possible to obtain an accurate normalized impedance.

Hereinafter, a description will be given of an embodiment of an electrode evaluation method according to the disclosure.

FIG. 1 is a block diagram functionally illustrating an electrode evaluation method according to this embodiment.

As illustrated in FIG. 1, the electrode evaluation method according to this embodiment is performed using a three-electrode electrolysis cell 100, a potentiostat 1, a recorder 2, and a control operation device 3. The three-electrode electrolysis cell 100 is a target of electrochemical measurement. The potentiostat 1 is coupled to the three-electrode electrolysis cell 100. The recorder 2 records measurement data by the potentiostat 1. The control operation device 3 performs control and calculation necessary for evaluation.

The three-electrode electrolysis cell 100 includes a working electrode 101, a counter electrode 102, and a reference electrode 103. The working electrode 101 is assumed to have a reaction based on Butler-Volmer equation. The reference electrode 103 is coupled to the proximity of the working electrode 101 via a Luggin capillary 104. The working electrode 101, the counter electrode 102, and the reference electrode 103 are each coupled to the potentiostat 1.

While in FIG. 1, an example where the three-electrode electrolysis cell is a measurement target electrode is described, the measurement target of the disclosure is not limited to the electrolysis cell. The measurement target may be, for example, a battery assembly. While the electrochemical measurement is basically performed with a three-electrode system, measurement in a two-electrode system where the reference electrode double as the counter electrode may be employed in the case where the counter electrode has low impedance and stable equilibrium potential.

As illustrated in FIG. 1, the control operation device 3 includes a load control unit 31, a DC characteristic acquiring unit 32, a DC characteristic analysis unit 33, an impedance acquiring unit 34, a normalized impedance calculation unit 35, and a presentation unit 36. The load control unit 31 controls the controlled-potential by the potentiostat 1 in accordance with a specific condition. The DC characteristic acquiring unit 32 acquires a direct current (DC) characteristic by a method such as cyclic voltammetry (CV), linear sweep voltammetry (LSV), and chrono amperometry (CA). The DC characteristic analysis unit 33 analyzes the DC characteristic acquired by the DC characteristic acquiring unit 32. The impedance acquiring unit 34 acquires an impedance characteristic (which is electrochemical impedance spectroscopy or EIS). The normalized impedance calculation unit 35 performs a series of normalization processes including various corrections on a result acquired by the impedance acquiring unit 34. The presentation unit 36 presents an analysis result of the DC characteristic analysis unit 33 and a frequency characteristic value acquired by the normalized impedance calculation unit 35 on a monitor or similar display. The recorder 2 may store the analysis result of the DC characteristic analysis unit 33 and the frequency characteristic value acquired by the normalized impedance calculation unit 35 in addition to data acquired from the three-electrode electrolysis cell 100.

Next, a description will be given of operations of the control operation device 3.

FIG. 2 is a flowchart illustrating the operations of the control operation device 3.

In step S1 of FIG. 2, an electrochemical pretreatment of an electrode (the working electrode 101) is performed. Subsequently, in step S2, LSV characteristics are acquired. These step S1 and step S2 are repeated several times while a sweep rate of LSV in step S2 is varied.

FIG. 3 is a diagram illustrating potential controls in the electrochemical pretreatment (step S1) and LSV characteristic measurement (step S2). A horizontal axis indicates time while a vertical axis indicates potential (with respect to the reference electrode). FIG. 3 illustrates a state where the electrochemical pretreatment (step S1) and the LSV characteristic measurement (step S2) are repeated for the first time, the second time, the third time, and so on. In the example of FIG. 3, the sweep rate gradually becomes slow each time the measurement is repeated for the first time, the second time, the third time and so on.

In the electrochemical pretreatment, to remove impurity on an electrode surface and cancel a potential history of the electrode, a fast potential sweep is cyclically applied until a steady state, that is, until a response state of the current becomes constant. Subsequently, the LSV characteristics are measured. A higher limit potential ($V_H$), a lower limit potential ($V_L$), a sweep rate, a sweep direction, and the number of sweeps in FIG. 3 can be changed in accordance with a condition for preventing electrode degradation and the like. When the LSV measurement is again performed with a different sweep rate, the fast potential sweep is cyclically applied each time to obtain reproducibility of the surface condition of the electrode.

Figure 4A:
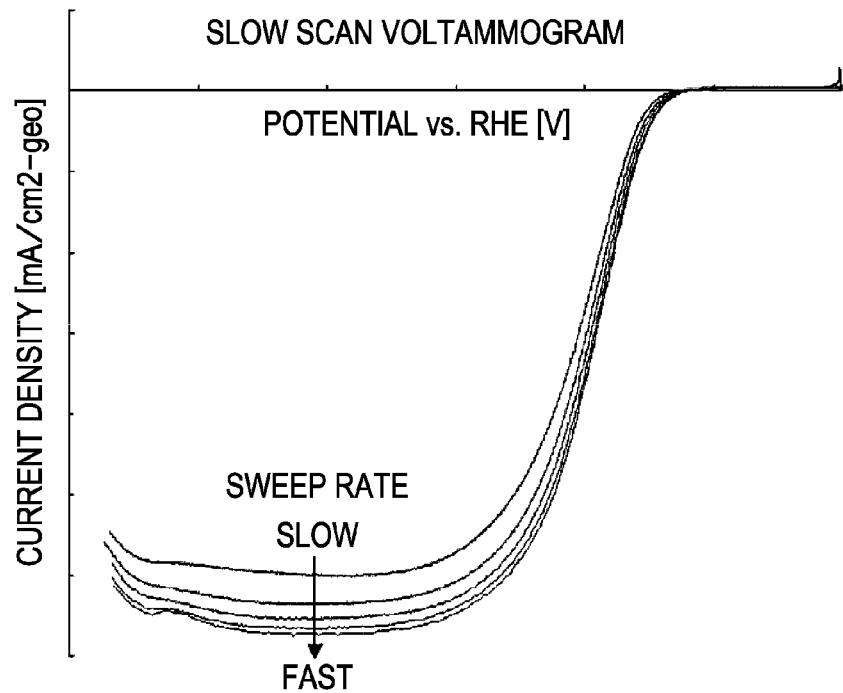
FIGS. 4A and 4B are graphs illustrating sweep rate dependence of LSV in a redox reaction.
Figure 4B:
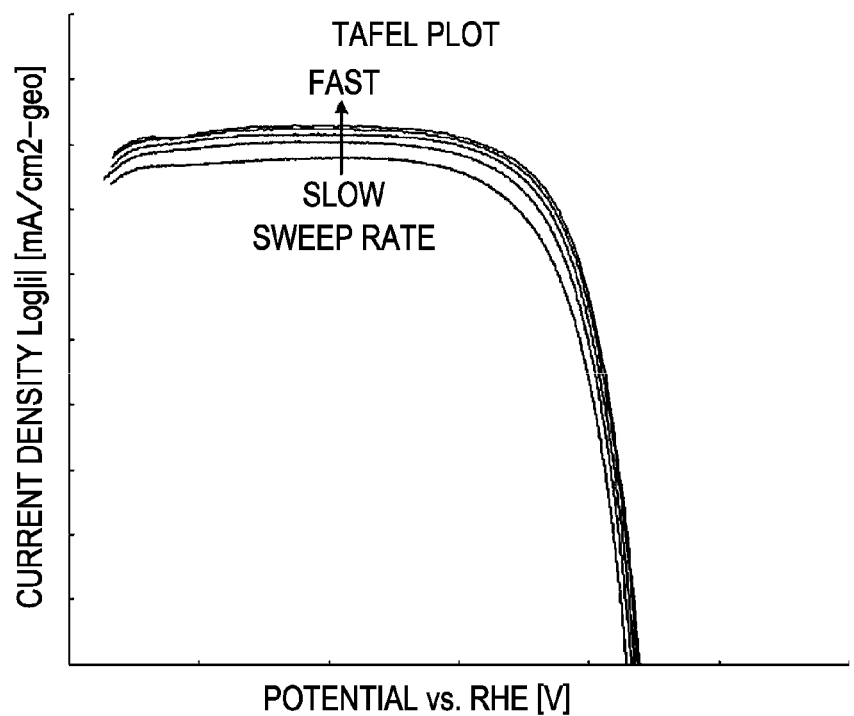

FIGS. 4A and 4B are graphs illustrating sweep rate dependence of LSV in a redox reaction. FIG. 4A is a graph where a vertical axis indicates a current value, and FIG. 4B is a graph where a vertical axis indicates the logarithm of a current value. Both horizontal axes indicate potentials (with respect to the reference electrode).

As illustrated in FIGS. 4A and 4B, catalyst activation becomes higher as the sweep rate becomes higher, and finally converges to a steady-state value. This is because surface adsorption of impurity and the like that hinders the electrode reaction cannot keep up with the sweep rate as the sweep rate becomes higher, and then influence of the surface adsorption becomes small. That is, in order to make a measurement potential reach a target measurement potential without influence of the surface adsorption of impurity and the like, it is necessary to perform the potential sweep at a sweep rate equal to or more than a sweep rate in the steady state. On the other hand, an excessively high sweep rate makes influence of background current such as charge/discharge current of the electrical double layer larger, thus causing an error. Accordingly, determination of an appropriate sweep rate is important to reach the target potential for impedance measurement.

For a stricter analysis, the evaluation may be performed after the following correction is preliminarily performed. The correction includes correction using the background current measured under an inert atmosphere such as the charge/discharge current of the electrical double layer, and IR correction (voltage correction using a product of a current value and a DC resistance value) using a direct current resistance acquired from an impedance value.

Here, catalyst activity evaluation (catalyst activity evaluation on DC) may be performed using LSV characteristics in the steady state.

Figure 5:
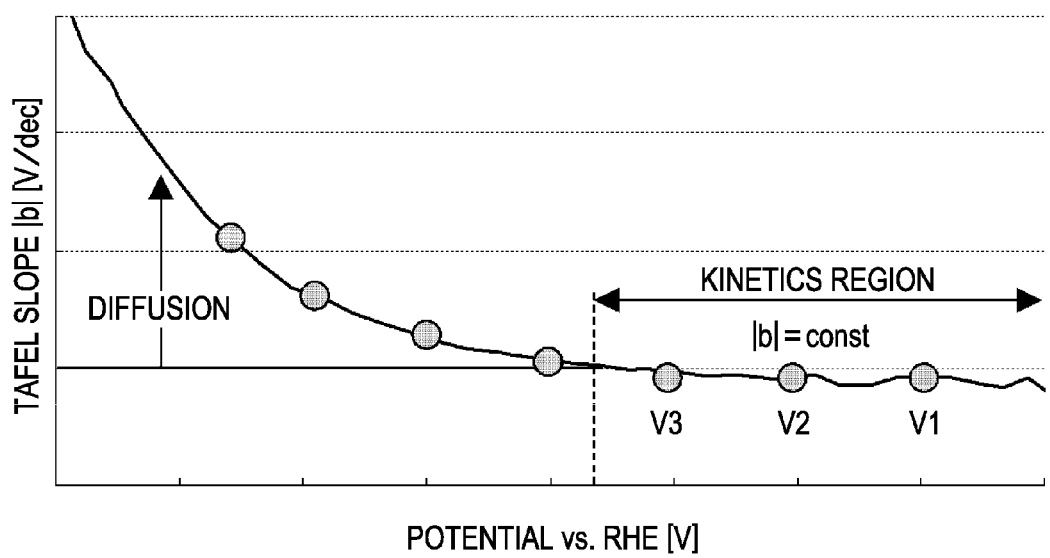
FIG. 5 is a graph illustrating potential-Tafel slope characteristic obtained from LSV characteristics in a steady state.

FIG. 5 is a graph illustrating potential-Tafel slope characteristic obtained from LSV characteristics in a steady state. This characteristic allows roughly separating a charge transfer-limited region and a diffusion-limited region and then determining a measurement potential region depending on the purpose.

Subsequently, in step S3, an impedance measurement protocol is determined. Here, for example, the slowest sweep rate among the acquired sweep rates that reach the above-described steady state is determined as "a sweep rate to reach the target measurement potential" based on LSV characteristics with different sweep rates acquired by repetition of step S1 and step S2. Based on the potential-Tafel slope characteristic in FIG. 5, a "potential range" and a "measurement potential" (such as measurement potentials V1, V2, and V3 in a potential range) to measure impedance are determined depending on the purpose.

Subsequently, in step S4, the electrochemical pretreatment of the electrode is performed. Subsequently, in step S5, a CA characteristic is acquired. Furthermore, in step S6, the electrochemical pretreatment of the electrode is performed again. Subsequently, in step S7, the impedance characteristic is acquired. These step S4 to step S7 are repeated for all measurement potentials V1, V2, . . . , and Vx while switching the measurement potential in accordance with the determined impedance measurement protocol (step S3).

Figure 6:
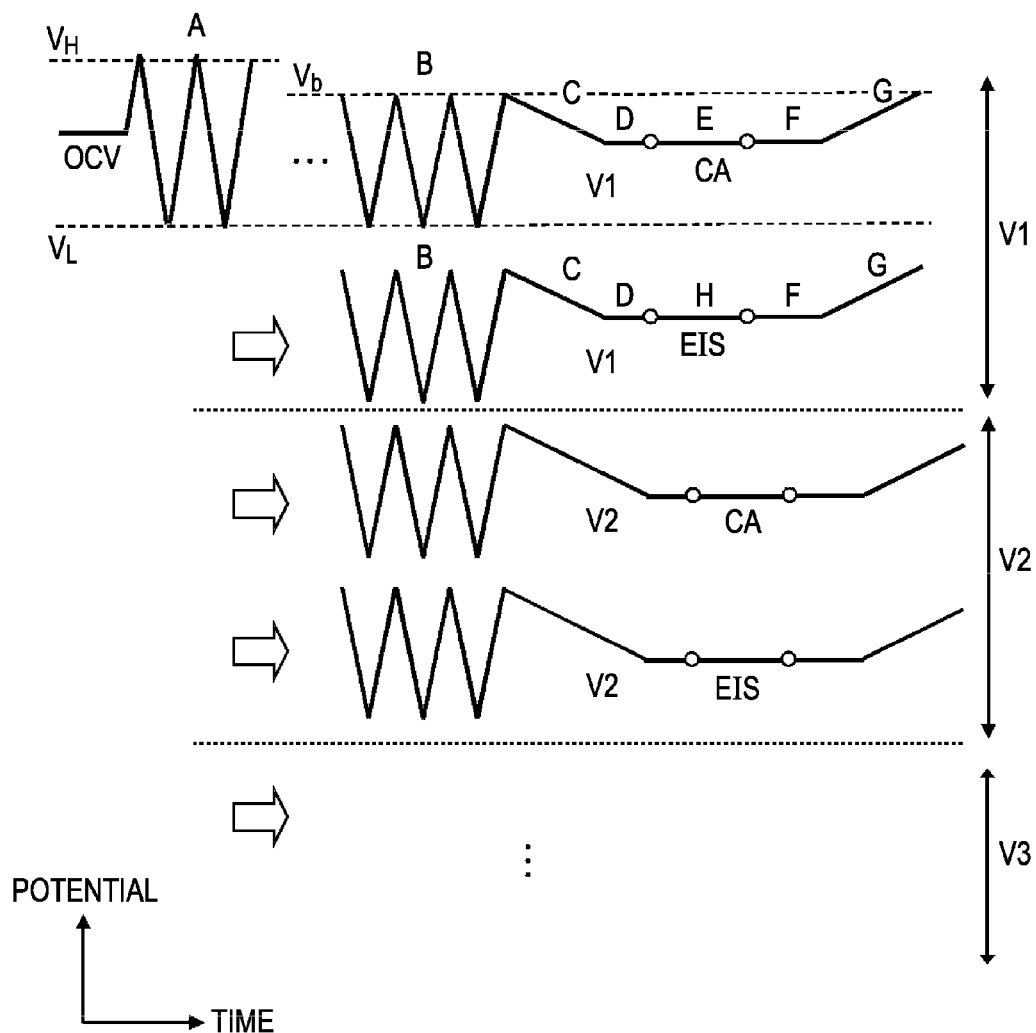
FIG. 6 is a diagram illustrating an impedance measurement protocol.

FIG. 6 is a diagram illustrating the impedance measurement protocol corresponding to a procedure that repeats step S4 to step S7. FIG. 6 illustrates respective processes of the impedance measurement protocol that are sectioned into A, B, C, D, E, F, G, and H.

First, the process "A" repeats the fast potential sweep to be in a steady state within as wide a potential range as possible (between a higher limit potential $V_H$ and a lower limit potential $V_L$) so as to remove impurity and similar matter attached to the electrode surface. This cleans the electrode surface.

Subsequently, the process "B" repeats the fast potential sweep several times between an initial potential $V_b$ and the lower limit potential $V_L$ to cancel the potential history of the electrode.

Subsequently, the process "C" sweeps the potential from the initial potential $V_b$ to the first measurement potential V1 at a "sweep rate to reach the target measurement potential" determined in step S3 based on the above-described LSV characteristics.

Subsequently, the process "D" waits for several seconds at the measurement potential V1 to release the background current such as the charge/discharge current of the electrical double layer caused by the sweep in the process "C", the current in the generation of the surface oxide, and the current in the reduction of the surface oxide.

Subsequently, the process "E" measures and records, with the CA, a temporal change in DC current value to be used for the normalization process on the impedance.

Subsequently, the process "F" measures and records, with the CA, a current value to confirm a DC current value immediately after completion of the impedance measurement.

Subsequently, the process "G" slowly returns the potential to the initial potential $V_b$ (FIG. 6) while controlling the potential.

Subsequently, the process returns to the process "B" again, and repeats a procedure (the processes "B", "C", "D", "H", "F", and "G" in this order) where the process "E" is replaced by the process "H". The process "H" performs impedance measurement (EIS) instead of the CA in the process "E". Here, at a measurement point for each measurement potential, AC voltage or AC current is superimposed to calculate impedance based on its response current or response voltage.

As described above, a series of the procedures at the measurement potential V1 is completed. At the measurement potentials V2, V3, . . . , and Vx, the procedure (the processes "B", "C", "D", "E", "F", and "G") for measuring the DC current value, and the procedure (the processes "B", "C", "D", "H", "F", and "G") for impedance measurement (EIS) are repeated.

Here, the higher limit potential $V_H$, the lower limit potential $V_L$, the initial potential $V_b$, the potential sweep rate, the number of potential sweeps, the potential sweep direction in FIG. 6 can be arbitrarily set in accordance with a purpose such as prevention of electrode degradation.

Subsequently, in step S8, a normalization process of a reaction arc is performed.

Figure 7A:
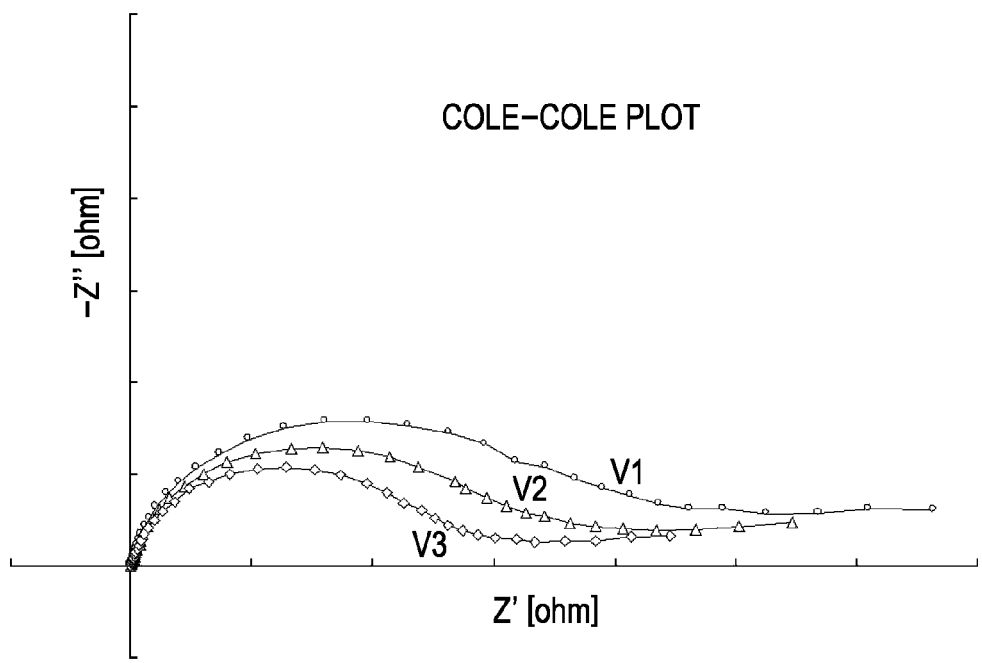
FIGS. 7A and 7B are graphs illustrating impedance characteristics.
Figure 7B:
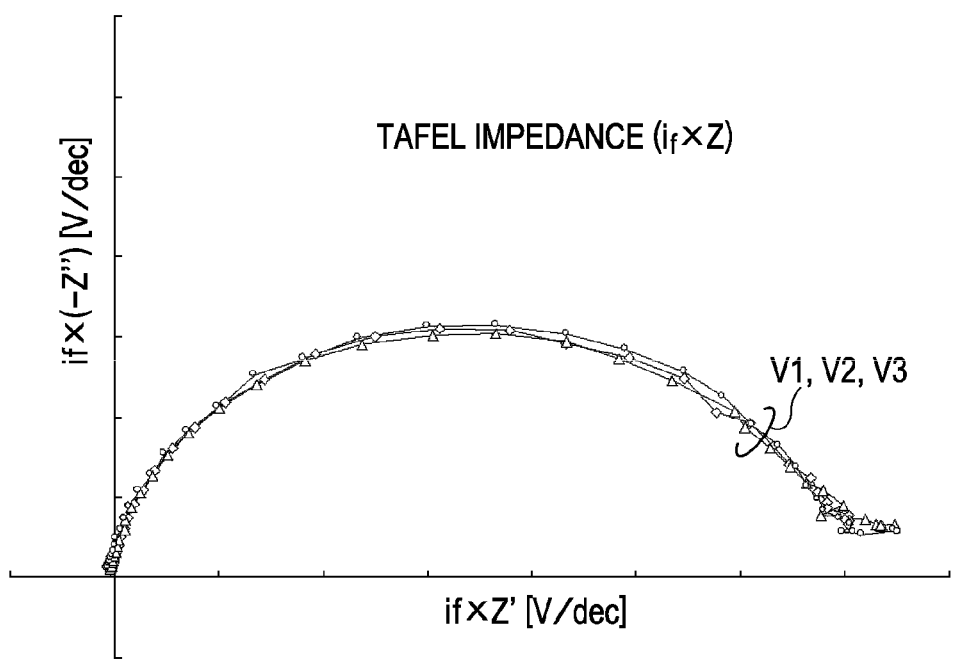

FIG. 7A illustrates impedance characteristics (a Cole-Cole plot) for respective measurement potentials (V1, V2, . . . , and Vx) acquired in the impedance measurement protocol (step S4 to step S7). FIG. 7B illustrates normalized impedance (if×Z) characteristics derived from catalytic reactions obtained by multiplying impedance illustrated in FIG. 7A by a DC current value if for each frequency.

In step S8, normalized impedance (if×Z) characteristics (FIG. 7B) derived from catalytic reactions is calculated by multiplying the impedance (FIG. 7A) obtained in the impedance measurement protocol (step S4 to step S7) by the DC current value if for each frequency. Here, in this embodiment, a temporal change in DC current value acquired in step S5 is associated with time at which impedance is measured for each frequency so as to acquire the DC current value if when the impedance is measured for each frequency (step S7). That is, the process "E" and the process "H" in FIG. 6 are assumed to temporally change the DC current value in the same way. This allows estimation of the DC current value if in the process "H".

Figure 8:
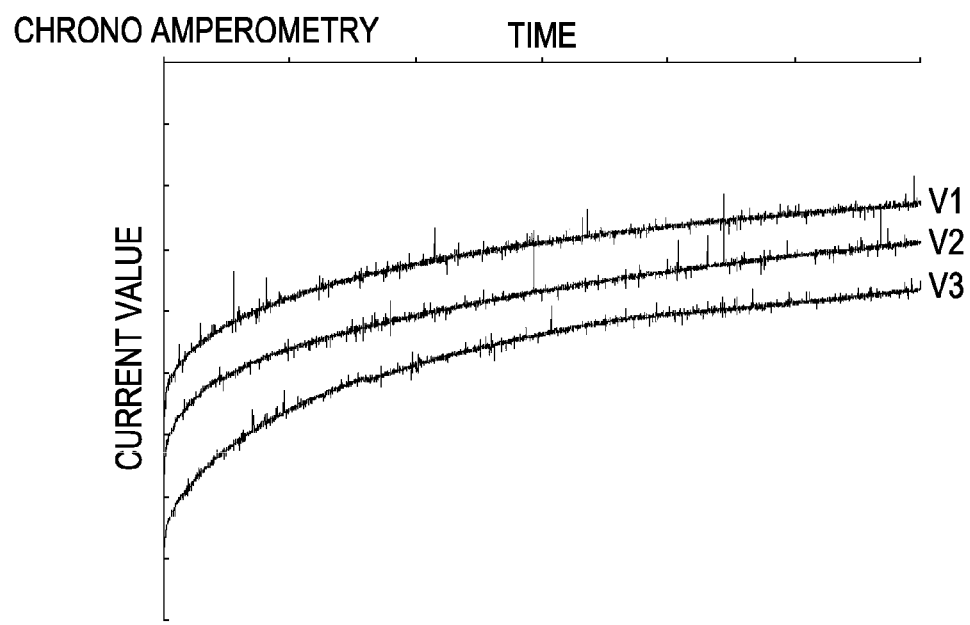
FIG. 8 is a graph illustrating temporal changes in DC current value at the measurement potentials V1, V2, and V3 in a process "E"

FIG. 8 illustrates temporal changes in DC current value at the measurement potentials V1, V2, and V3 in the process "E". As illustrated in FIG. 8, DC currents (absolute values) at the respective measurement potentials decrease with time. Step S8 applies the temporal change in DC current value acquired from the process "E" to acquisition of the impedance in the process "H" so as to extract the DC current value.

In the case where a potentiostat that can output a DC current value in real time is used when the impedance is acquired, the procedure from step S4 to step S5 may be omitted.

Here, a description will be given of a relationship between the impedance and the measured current value when the impedance is measured.

Especially in a region (a concentration-independent region) where an influence of diffusion does not appear, there is a relationship of a Tafel equation (equation (1)) between current I and voltage E.

$$E = a + b \log I \quad \text{equation (1)}$$

The symbol b in equation (1) denotes a Tafel slope. On the other hand, in the impedance measurement, a response of an output voltage with respect to AC modulation of an input current is assumed to have a linear relationship so as to calculate impedance by equation (2).

$$Z = dE/dI \quad \text{equation (2)}$$

Equation (1) results in a relationship of equation (3) in the concentration-independent region.

$$dE/dI = b/I \quad \text{equation (3)}$$

Accordingly, in the concentration-independent region, a product I·Z where impedance Z is multiplied by the measured current value I is a constant value.

This relationship is mentioned in, for example, a literature of "Analysis of Relationship between Current Distribution and Impedance in Porous Electrode, Shigenori Mitsushima, Nobuyuki Kamiya, and Kenichiro Ota, Electrochemistry, pp. 810-814, 2006". This literature discloses that deformation of an I·Z arc when the frequency is varied is used for analysis of a ratio of ionic resistance to electronic resistance.

Accordingly, plotting the product I·Z of the impedance Z and the measured current value I removes an influence of current density. This allows visually determining the concentration-independent region, the concentration-dependent region, or the region with a specific Tafel slope. Therefore, for example, this allows understanding which range in an operating condition of a fuel battery cell corresponds to the concentration-independent region or the region with the specific Tafel slope in the fuel battery cell.

The plot of the product I·Z is presented not only as a parameter such as the Tafel slope in the steady state, but also as a dynamic parameter of a frequency characteristic. In view of this, for example, information of the product I·Z is widely used not only for simply presenting the Tafel slope as a parameter to determine degradation in electrode performance, but also as a parameter to indicate various aspects of the performance of the fuel cell.

Subsequently, step S9 allows performing various characteristic evaluations such as model fitting, analysis of current distribution, and extraction of a diffusion evaluation parameter using the normalized impedance (if×Z) characteristic (FIG. 7B) acquired in step S8.

Hereinafter, a description will be given of an example where the electrode evaluation method according to the disclosure is applied to the acquisition of the normalized impedance and the extraction of the diffusion evaluation parameter in the fuel battery cell.

(Acquisition of the Normalized Impedance in the Fuel Battery Cell)

Figure 9:
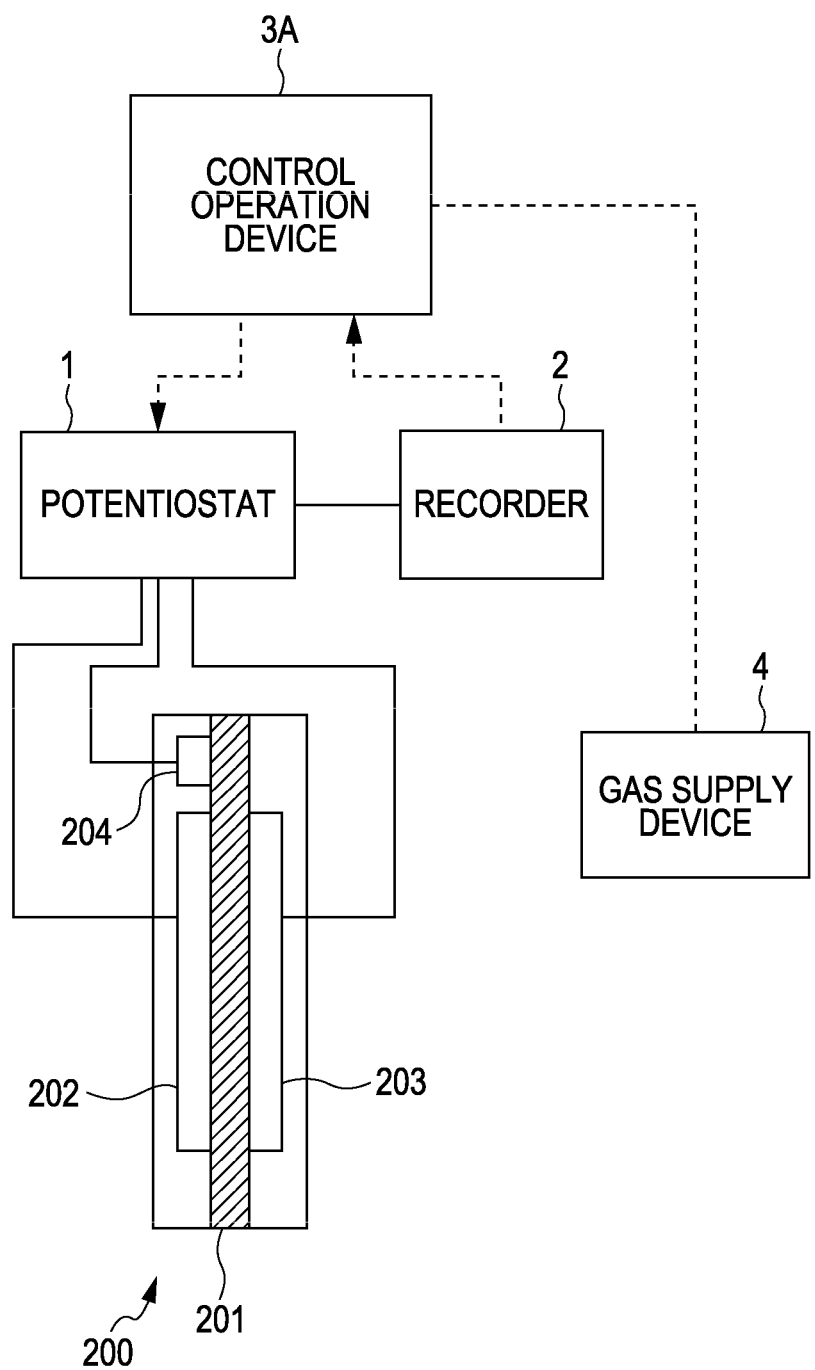
FIG. 9 is a block diagram illustrating a measurement system for a fuel battery cell.

FIG. 9 is a block diagram illustrating a measurement system for the fuel battery cell as an electrode evaluation apparatus according to the disclosure.

A fuel battery cell 200 illustrated in FIG. 9 is a single cell, and employs a structure where an electrolyte membrane 201 with a surface modified with a Pt/C catalyst is sandwiched between an anode electrode 202 and a cathode electrode 203. The anode electrode 202 and the cathode electrode 203 each include a gas diffusion layer. At the anode electrode 202 side, a separated electrode 204 separated from the anode electrode 202 is disposed. The anode electrode 202 and the separated electrode 204 are insulated from each other.

In the measurement, hydrogen is supplied to the anode electrode 202 while air or oxygen is supplied to the cathode electrode 203, which results in a power generation state. The electrochemical measurement is performed with the three-electrode system. When a cathode characteristic is evaluated, the cathode electrode 203 functions as the working electrode while the anode electrode 202 functions as the counter electrode. Another separated electrode 204, which is insulated from the anode electrode 202 and the cathode electrode 203, at the anode side functions as the reference electrode (RHE). As illustrated in FIG. 9, the anode electrode 202, the cathode electrode 203, and the separated electrode 204 are each coupled to the potentiostat 1. A measurement result by the potentiostat 1 is forwarded to the recorder 2.

As illustrated in FIG. 9, the potentiostat 1 and the recorder 2 are coupled to a control operation device 3A. The control operation device 3A performs control of the potentiostat 1, acquisition of the above-described measurement result from the recorder 2, and calculation based on the above-described acquired measurement result.

In the fuel battery cell 200, hydrogen is supplied to the anode electrode 202 while air or oxygen is supplied to the cathode electrode 203. These supply gases are provided through a gas supply device 4 illustrated in FIG. 9. The gas supply device 4 is coupled to the control operation device 3A. A gas concentration, a flow rate, a temperature, and similar parameter of the gas supplied to the fuel battery cell 200 are controlled by the control operation device 3A through the gas supply device 4.

Figure 10:
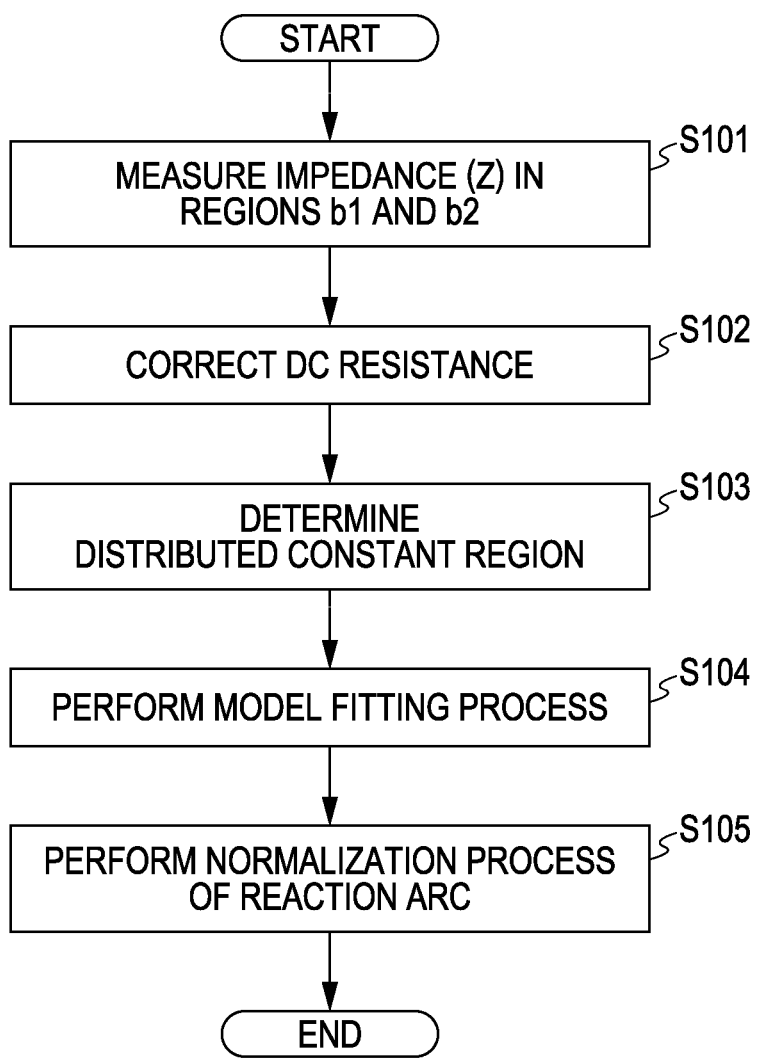
FIG. 10 is a flowchart illustrating extraction of reaction resistance and a normalization process for impedance.

FIG. 10 is a flowchart illustrating extraction of reaction resistance and a normalization process for impedance in the fuel battery cell. In accordance with a procedure illustrated in this flowchart, the reaction resistance can be extracted and the normalized impedance can be acquired in the fuel battery cell that is a measurement target.

First, in step S101, impedance is measured and recorded in respective regions b1 and b2 with different Tafel slopes using the above-described impedance measurement protocol (step S4 to step S7). The respective Tafel slopes are different between the regions b1 and b2. In the region b1, most of a platinum surface is covered with adsorbed oxygen species (oxide coating), and a Tafel slope caused by a reaction, what is called Temkin-Type, is observed. On the other hand, in the region b2, all oxides on the platinum surface are reduced, and a Tafel slope caused by a reaction of the bare platinum surface, what is called Langmuir-Type, is observed.

Figure 11:
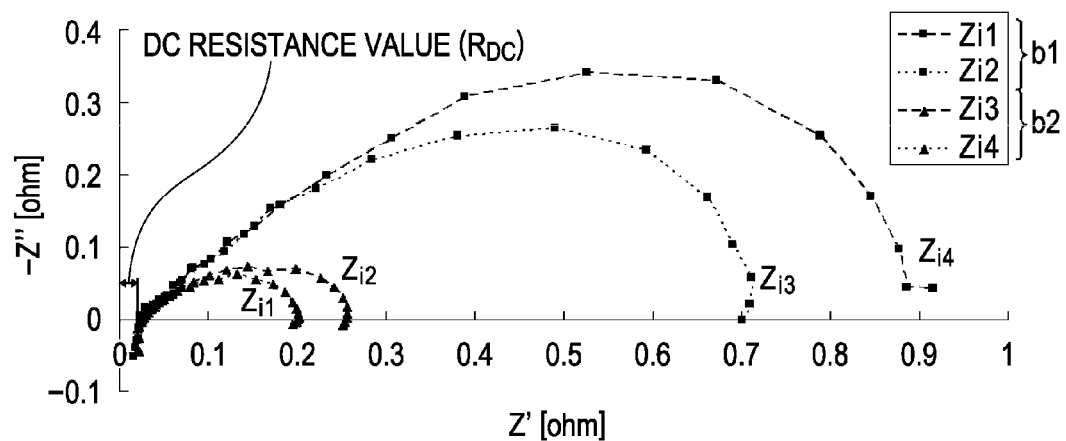
FIG. 11 is a graph illustrating impedance acquired based on measurements in regions b1 and b2.

FIG. 11 is a graph illustrating impedance acquired by the impedance acquiring unit 34 based on the measurements in the regions b1 and b2. FIG. 11 indicates an impedance Zi1 at a current i1, an impedance Zi2 at a current i2, an impedance Zi3 at a current i3, and an impedance Zi4 at a current i4. The current i1 and the current i2 correspond to the region b1 while the current i3 and the current i4 correspond to the region b2. These currents have a relationship of i1<i2<i3<i4.

Here, a point intersecting with a real axis of the impedance is defined as a zero-cross point. In the example illustrated in FIG. 11, a zero-cross value at a high frequency side is not zero and has a DC resistance component ($R_{DC}$). This DC resistance component is not directly related to the reaction resistance. Accordingly, a zero-cross value at a high frequency in step S102 is assumed to be a DC resistance value. Origin correction is performed by subtraction of this DC resistance value.

Figure 12:
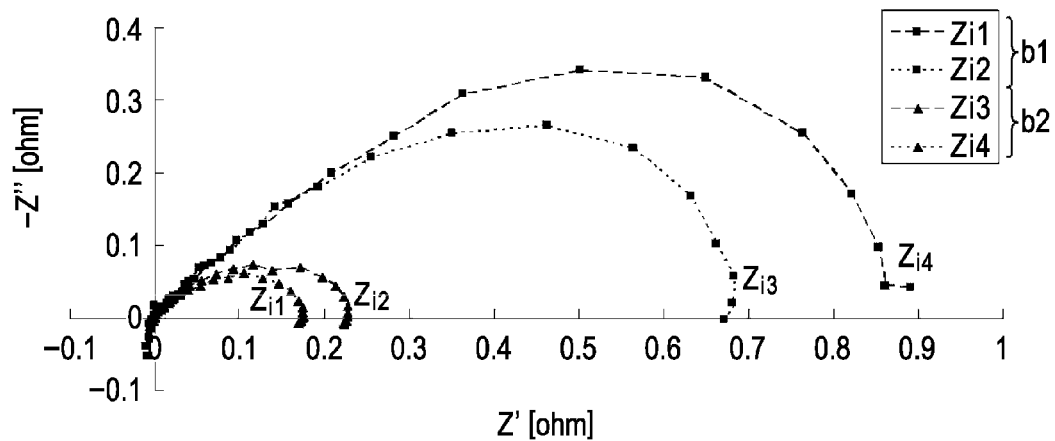
FIG. 12 is a graph illustrating impedance after DC correction is performed.

FIG. 12 is a graph illustrating impedance after DC correction is performed in step S102. It can be confirmed from FIG. 12 that the zero-cross value at a high frequency is the origin.

FIG. 13A is a graph illustrating a |Z|-f characteristic and a θ-f characteristic of impedance illustrated in FIG. 12 (after DC resistance correction).

Subsequently, at step S103, a distributed constant region is determined. As can be seen from FIG. 12 and FIGS. 13A and 13B, a straight line region appears in the impedance at the high frequency side. Generally, it is known that a straight line (the distributed constant region) at 45° appears at a high frequency side in a porous electrode. FIG. 13B illustrates equations eq. 1, eq. 2, and eq. 3 that are satisfied in the distributed constant region.

These equations show that the distributed constant region does not depend on reaction resistance $R_{ct}$. Accordingly, removal of the distributed constant region is also necessary for accurately separating a reaction using normalization described later.

FIG. 13A illustrates an exemplary region determined as the distributed constant region in step S103. The example of FIG. 13A accepts the possibility that proton transfer resistance ($R_{ion}$) in a catalyst and electrical double-layer capacitance ($C_{d1}$) vary in a reaction process. This example determines a frequency from the zero-cross frequency to a frequency in a "region (a part of a gray strip) with the θ-f characteristic of 45°±5°" and "within 5% of difference between zero-cross values at low frequencies in comparison of impedances |Z| with the same reaction processes and different operating points" as the distributed constant region. However, a specific determination of the distributed constant region may be changed based on the following thoughts as necessary. For example, the proton transfer resistance in the catalyst does not change in a different reaction process. The straight line is not always limited to 45°.

Subsequently, in step S104, a model fitting process where the distributed constant region is excluded is performed.

Figure 14:
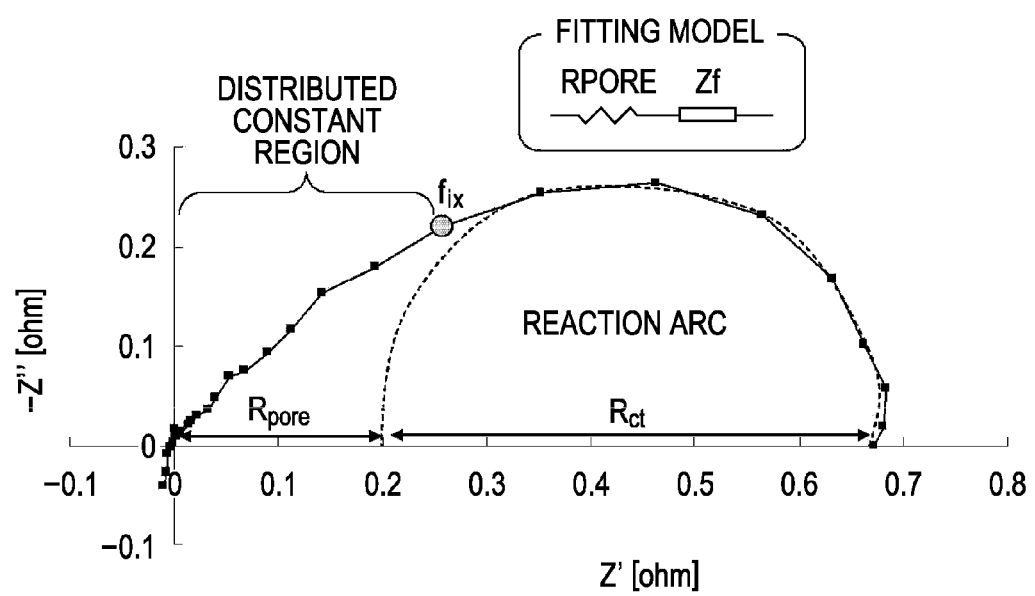
FIG. 14 is a graph illustrating a method for a model fitting process.

FIG. 14 is a graph illustrating a method for a model fitting process in step S104. Here, fitting software is used to perform model fitting only in a frequency band other than the distributed constant region, that is, in a frequency band affected by the reaction resistance at low frequency. FIG. 14 illustrates an example of Zi3 only. An upper limit frequency of the distributed constant region regarding Zi3 is assumed to be $f_{ix}$. Here, a DC resistance component caused by a distribution characteristic (transmission line model) is collectively defined as $R_{pore}$. An equivalent circuit model employs a circuit (illustrated in FIG. 14) where $R_{pore}$ and a reactive impedance model ($Z_f$) are coupled in series. The reactive impedance model ($Z_f$) is preferred to employ a model considered to express an actual reaction process. The model may be selected as necessary. Here, an example where a second-order model of an RC parallel circuit is used as $Z_f$ to perform fitting is simply illustrated. This fitting allows acquiring values of $R_{ct}$ and $R_{pore}$ and simply extracting the reaction resistance as the reaction arc.

Figure 15:
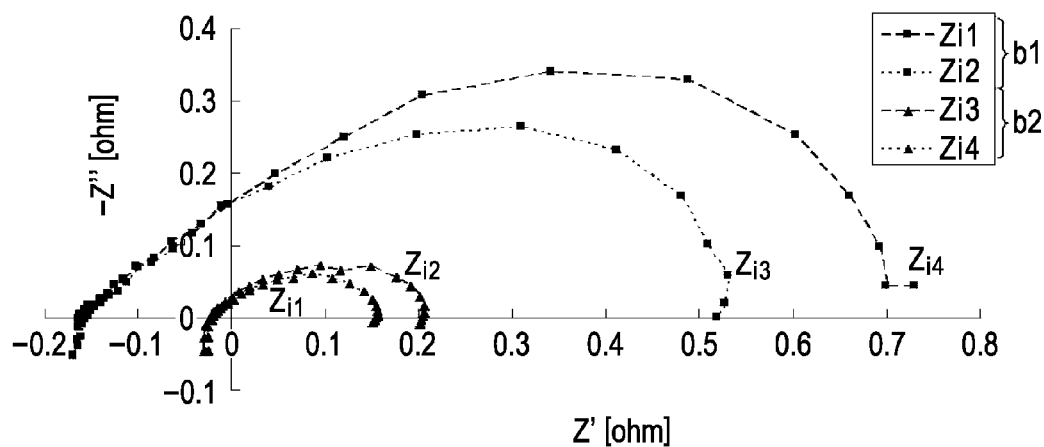
FIG. 15 is a graph illustrating impedance where origin correction is performed in consideration of a distributed constant region.

FIG. 15 is a graph illustrating impedance where origin correction is performed in consideration of the distributed constant region. In FIG. 15, $R_{pore}$ acquired by the above-described procedure is subtracted from the impedance illustrated in FIG. 12 so as to redefine the origin.

Here, both of the processes in step S102 and step S104 are processes that remove a DC resistance component. Accordingly, in step S104, ($R_{pore}+R_{DC}$) may be collectively calculated.

Subsequently, in step S105, the normalization process is performed on impedance where a DC resistance component is removed and only reaction resistance is extracted. Here, multiplying the impedance (FIG. 15) after the origin correction by a current value at the operating point of the impedance measurement normalizes impedance. Here, with the above-described procedure in step S8, a current value is extracted for each measurement point and each measurement frequency, and multiplied by the impedance.

Figure 16:
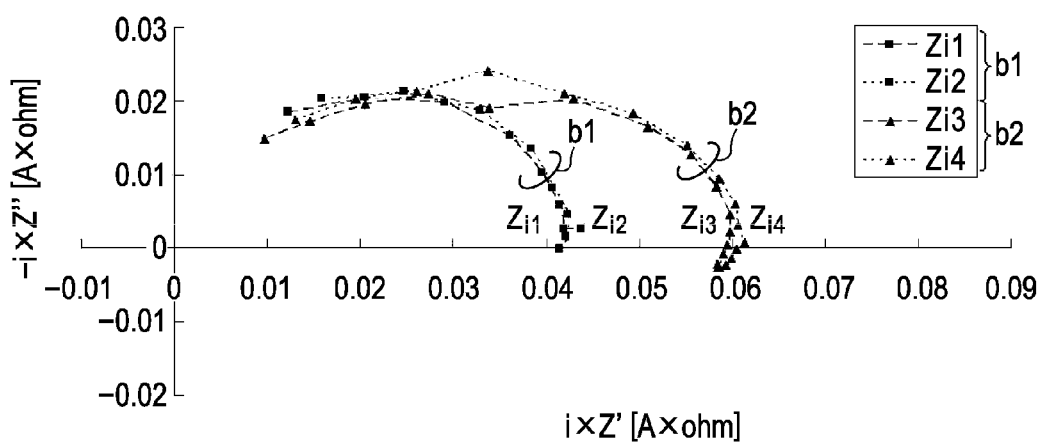
FIG. 16 is a graph illustrating impedance characteristics acquired by the normalization process on extracted reaction resistance.

FIG. 16 is a graph illustrating impedance characteristics (frequency characteristics) acquired by the normalization process on the extracted reaction resistance.

It can be confirmed from FIG. 16 that the normalized impedance can be accurately separated for each reaction process (the regions b1 and b2). That is, it is conformed that plots corresponding to Zi1 and Zi2 are overlaid approximately on the same curved line while plots corresponding to Zi3 and Zi4 are overlaid approximately on the same curved line. Accordingly, this allows determining whether the reaction process of the regions b1 and b2 is performed based on the impedance characteristic, and also estimating impedance at a different current value. This allows discussing respective characteristics in the reaction processes based on the shape, magnitude, and similar parameter of this normalized impedance. Additionally, the normalized impedance can be widely used as a parameter indicating various aspects of the performance of the fuel cell.

(Extraction of the Diffusion Evaluation Parameter in the Fuel Battery Cell)

The diffusion evaluation parameter is extracted in the fuel battery cell using the measurement system in FIG. 9. The fuel battery cell 200 has a configuration illustrated in FIG. 9.

Figure 17:
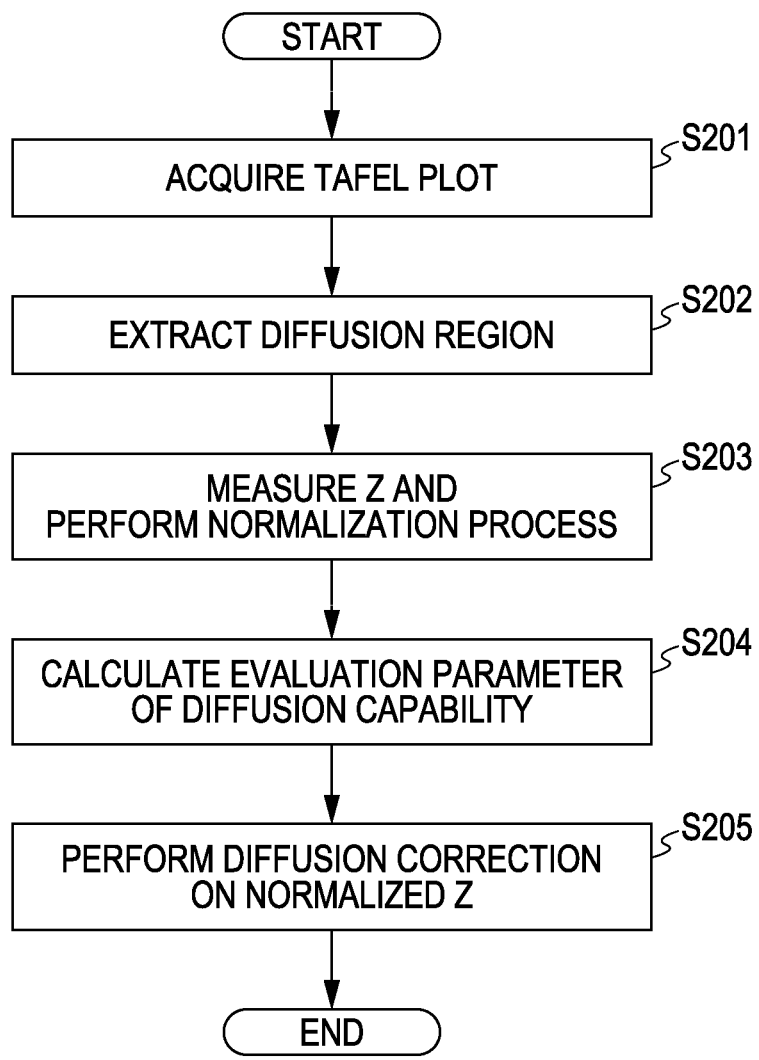
FIG. 17 is a flowchart illustrating operations of the measurement system.

FIG. 17 is a flowchart illustrating operations of the measurement system. FIGS. 18 to 25 are graphs illustrating display examples by the control operation device 3A.

In step S201 of FIG. 17, an IV characteristic is measured by voltage sweep or current sweep to acquire a Tafel plot indicative of a relationship between logarithm of current and voltage.

FIG. 18 is a graph illustrating a Tafel plot measured to a diffusion region.

As illustrated in FIG. 18, a known oxygen reduction reaction generally has two Tafel slopes (the regions b1 and b2). The diffusion region does not have a straight line region and its gradient changes as the current becomes larger.

Here, a description will be given of an electrode reaction equation considering diffusion of a reactant. In the case where polarization is sufficiently large and current of reverse reaction is negligible, current i and overvoltage η can be expressed by equations eq. 11 and eq. 12 illustrated in FIG. 18.

Furthermore, the equation eq. 12 is modified as follows to obtain an equation eq. 13 illustrated in FIG. 18.

A left side of the equation eq. 13 expresses impedance ($d\eta/di$) multiplied by the current value i, which is a value corresponding to the Tafel slope. Here, operation of multiplying the impedance by the current value is referred to as a normalization process.

In the case where a diffusion limited current $i_L$ is sufficiently larger than the measured current i, approximation in the equation eq. 13 is possible. This equation confirms that a term proportionate to current caused by diffusion is added to the Tafel slope ($2.3 RT/\alpha nF$) of the reaction in a region where an influence of the diffusion appears.

Here, based on the relationship of the above-described equation (3), the product I·Z that is impedance Z multiplied by measured current value I is a constant value in the concentration-independent region.

Subsequently, in step S202, the diffusion region is extracted.

Here, first, a differentiated value (a gradient of the Tafel plot) of the Tafel plot illustrated in FIG. 18 at each measurement point is calculated.

Figure 19A:
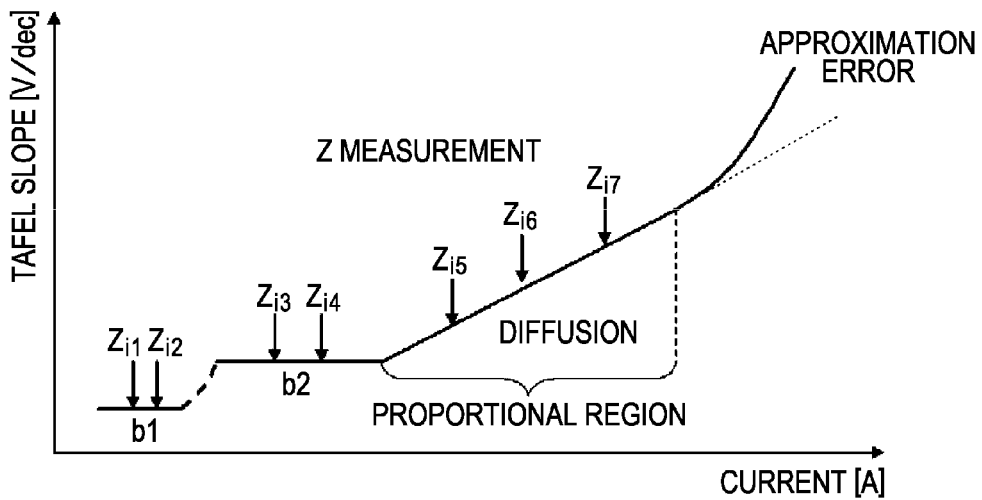
FIGS. 19A and 19B are graphs illustrating Tafel plots.

FIG. 19A is a graph illustrating a Tafel slope as a current-Tafel slope characteristic. The Tafel plot illustrated in FIG. 18 is differentiated at each measurement point, and an absolute value of the differentiation result is defined as the Tafel slope. Here, the straight line region on the Tafel plot is expressed as a plateau region. Two plateaus that indicate the regions b1 and b2 are confirmed. As illustrated in the equation eq. 13, in a region (a region beyond the region b2) affected by the diffusion, the term proportionate to current is added to the Tafel slope, thus forming a proportional region. Since the equation eq. 13 is an approximate equation that is satisfied when the diffusion limited current $i_L$ is sufficiently larger than the measured current i, this proportional region becomes larger as concentration of the reactant (oxygen) becomes higher and rate of utilization is lower.

Figure 19B:
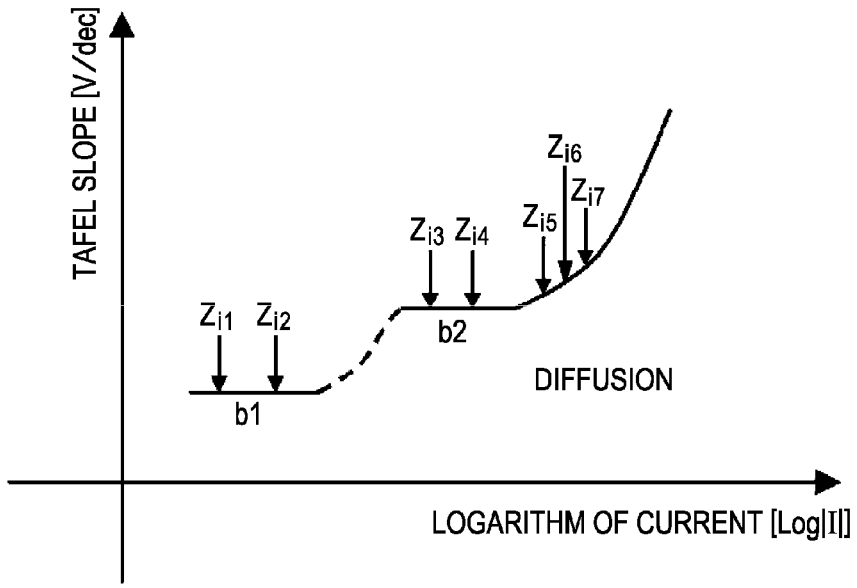

FIG. 19B illustrates the same characteristic as that of FIG. 19A as a logarithm of current-Tafel slope characteristic. Since the measured current value is plotted on a linear axis in FIGS. 19A and 19B, the region b1 that appears in a small current region may be invisible on the graph. In this case, plotting the measured current value on a logarithmic axis as illustrated in FIG. 19B allows easily determining the region b1. This allows, for example, accurately determining the measured operating point of the impedance.

Figure 20:
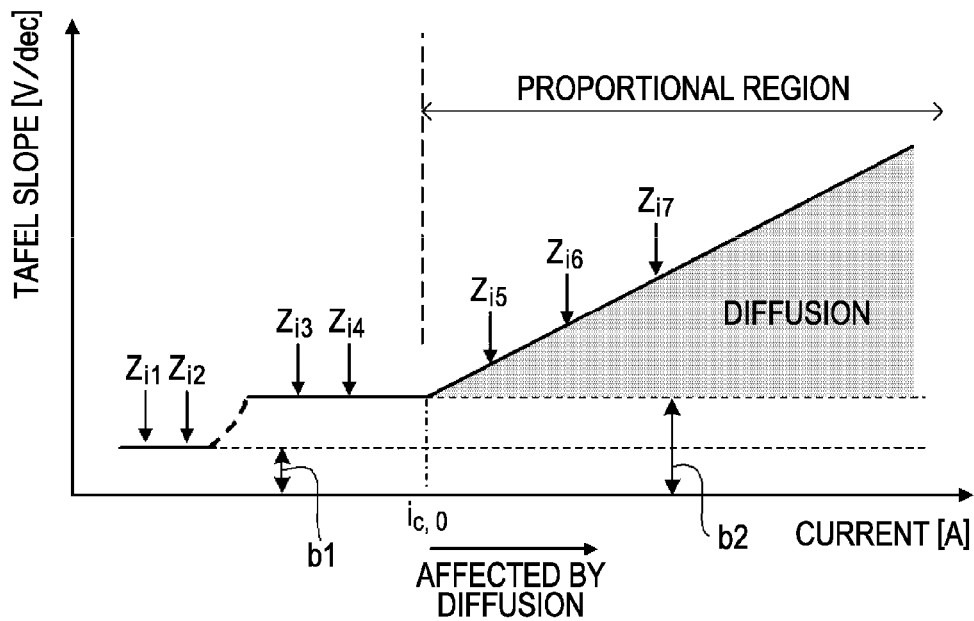
FIG. 20 is a graph illustrating a current-Tafel characteristic in the case where an influence of diffusion appears from the region b2.

FIG. 20 is a graph illustrating a current-Tafel characteristic in the case where an influence of diffusion appears from the region b2. Finding the proportional region illustrated in FIG. 20 allows obtaining the diffusion term. Here, current that starts to be affected by the diffusion is defined as $i_{c,0}$. In FIG. 20, a portion corresponding to the diffusion term in the proportional region is shaded. This is similar in FIG. 21 described below.

As illustrated in FIG. 20, from the boundary at the current $i_{c,0}$, the Tafel slope takes a value to which a diffusion term proportionate to current is added in the Tafel slope corresponding to the region b2.

Figure 21:
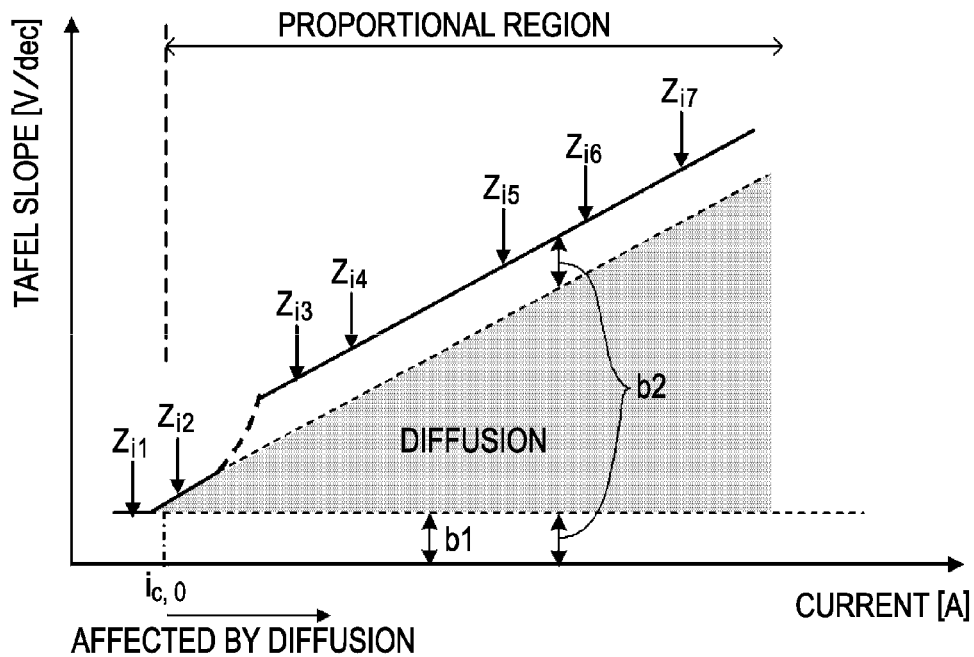
FIG. 21 is a graph illustrating a current-Tafel characteristic in the case where an influence of diffusion appears from the region b1.

FIG. 21 is a graph illustrating a current-Tafel characteristic in the case where an influence of diffusion appears from the region b1. Also in this case, finding the shaded proportional region allows acquiring the diffusion term. As illustrated in FIG. 21, from the boundary at the current $i_{c,0}$, the Tafel slope takes a value to which diffusion terms proportionate to current are added in the respective Tafel slope corresponding to the region b1 and the Tafel slope corresponding to the region b2. A gradient of the straight line generated by the diffusion term is constant in all regions.

Figure 22:
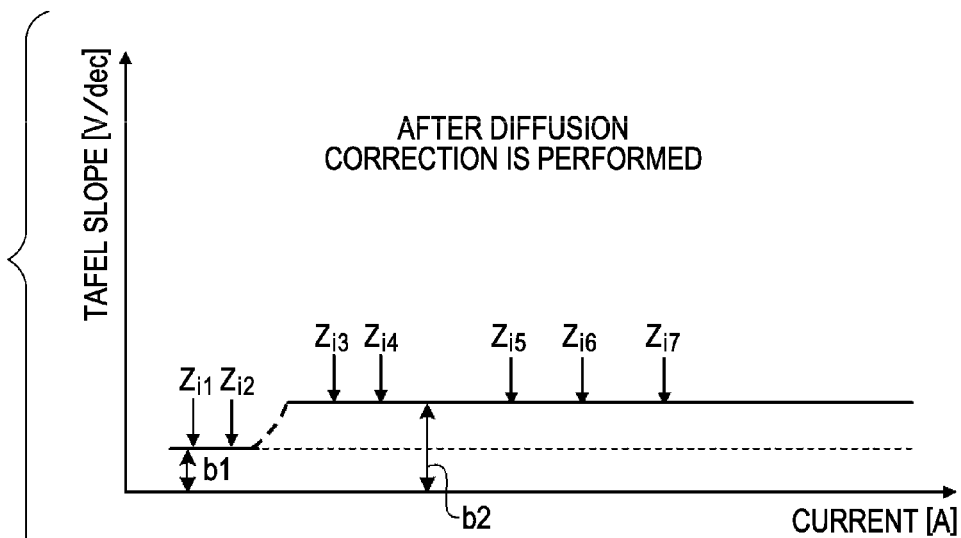
FIG. 22 is a graph illustrating a current-Tafel slope characteristic where diffusion correction is performed.

FIG. 22 is a graph illustrating a current-Tafel slope characteristic where diffusion correction is performed. The diffusion correction removes diffusion terms (shaded portions) in FIGS. 20 and 21, and only plateaus that indicate the regions b1 and b2 appear. The diffusion correction corresponds to a process in step S205 describe later.

Subsequently, in step S203, impedance measurement and the normalization process on the measured impedance are performed. Here, the above-described impedance measurement protocol (step S4 to step S7) is used to measure and record the impedance. Then, the normalization process is performed on the recorded impedance.

Figure 23:
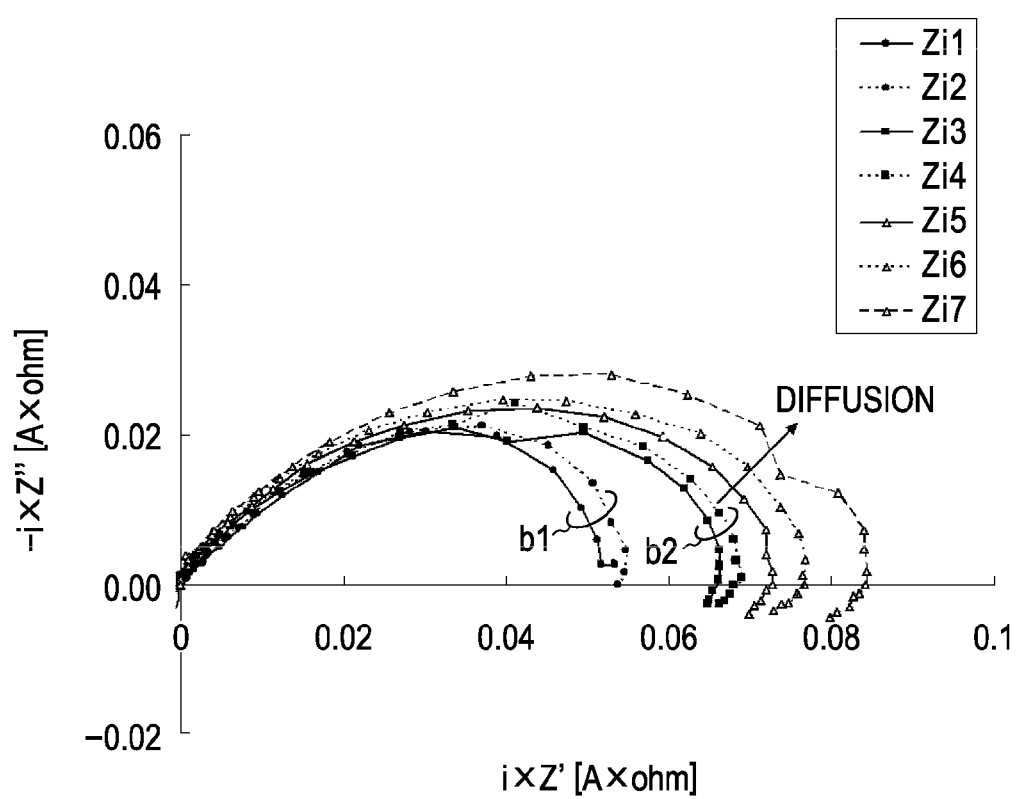
FIG. 23 is a graph illustrating normalized impedance measured at respective operating points.

FIG. 23 is a graph illustrating normalized impedances Zi1 to Zi7 measured at respective operating points of i1 to i7. In FIGS. 19A and 19B to FIG. 22, operating points where the individual normalized impedances Zi1 to Zi7 are measured are indicated by arrows (↓). In FIGS. 19A and 19B to FIG. 20, the normalized impedances Zi1 and Zi2 correspond to the region b1, the normalized impedances Zi3 and Zi4 correspond to the region b2, and the normalized impedances Zi5 to Zi7 correspond to the region b2 and the diffusion region. In FIG. 21, the normalized impedance Zil corresponds to the region b1, the normalized impedance Zi2 corresponds to the region b1 and the diffusion region, and the normalized impedances Zi3 to Zi7 correspond to the region b2 and the diffusion region.

FIG. 23 illustrates a case where the diffusion appears in the middle of the region b2 (corresponding to FIGS. 19A and 19B to FIG. 20).

As illustrated in FIG. 23, the impedance in the region b1 and the impedance in the region b2 are collected to make respective common groups of curved lines by normalization. With the addition of influence of the diffusion, the normalized impedance becomes higher as the current at the operating point becomes higher. That is, the influence of the diffusion shifts the curved line to a position apart from the group of the curved lines in the region b2.

Subsequently, in step S204, an evaluation parameter of diffusion capability ($C_{(f)}$) is calculated.

Here, a description will be given of a method for calculating the evaluation parameter of diffusion capability ($C_{(f)}$). FIG. 22 illustrates a formula for calculating the evaluation parameter in the normalized impedance as an equation eq. 14.

This equation divides a difference between normalized impedances ($iZ_{(f)}$) at two points in the diffusion region by a difference between current values at respective operating points. Therefore, this operation corresponds to obtaining a gradient of the straight line in the proportional region illustrated in FIG. 20 or 21. That is, this allows extracting an evaluation parameter value independent from the current.

Figure 24:
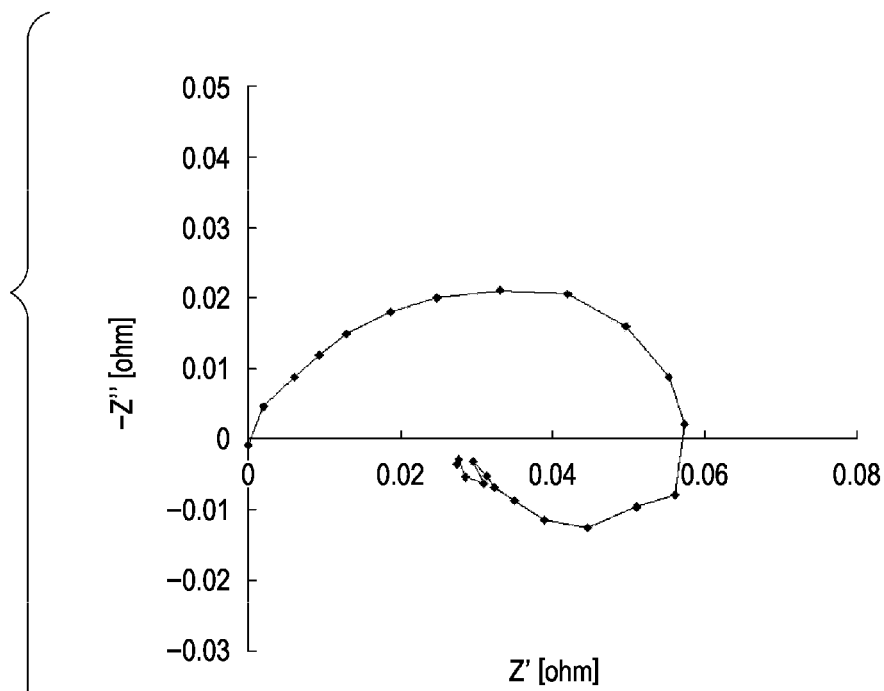
FIG. 24 is a graph illustrating an exemplary calculated evaluation parameter of diffusion capability.

FIG. 24 is a graph illustrating an exemplary evaluation parameter of the calculated diffusion capability. Obtaining the evaluation parameter with the frequency information caused only by diffusion allows discussing diffusion capability from a wider perspective. Use of the evaluation parameter of the diffusion capability also allows estimating impedance at an operating point where measurement is not actually performed. This process corresponds to a function of an estimation unit.

Subsequently, in step S205, correction of the diffusion term is performed using the evaluation parameter of the diffusion capability. An equation eq. 15 illustrated in FIG. 24 is a correction equation illustrating a method for correcting the diffusion term using the evaluation parameter of the diffusion capability.

This equation performs the following correction. An evaluation parameter ($C_{(f)}$) is multiplied by a difference between a current value ($i_x$) at a measured operating point and a current value ($i_{c,0}$) where diffusion starts to have an influence. This result is subtracted from the original normalized impedance (($iZ_{(f)})_{C,x}$).

That is, a diffusion term at any operating point in the diffusion region is obtained and then subtracted to correct the original normalized impedance.

Figure 25:
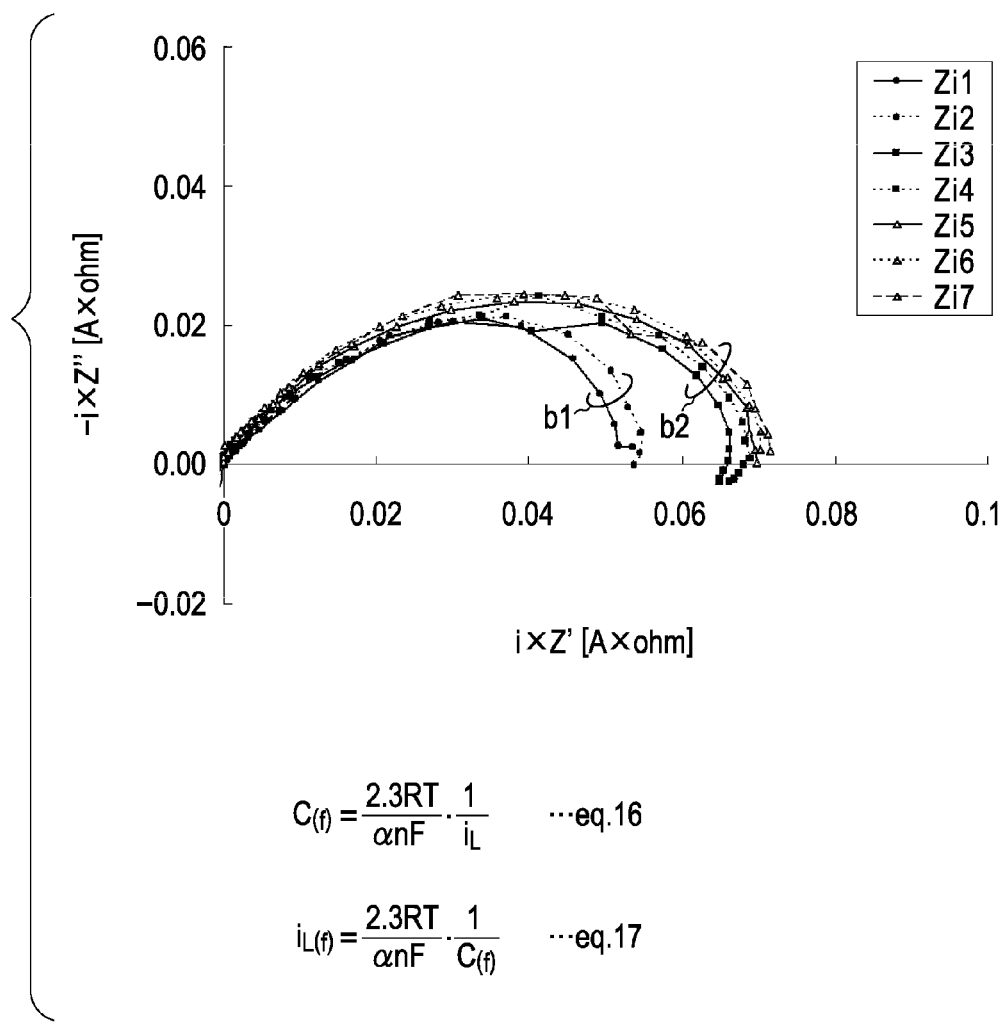
FIG. 25 is a graph illustrating normalized impedance where diffusion correction is performed.

FIG. 25 is a graph illustrating normalized impedance where diffusion correction is performed. As is clear from comparison with FIG. 23, the above-described method removes the influence of the diffusion term. Thus, it is confirmed that the group of the curved lines indicative of the measurement result in the diffusion region is shifted to a position indicative of the normalized impedance in the region b2. This allows accurately calculating and evaluating the normalized impedance in the region b2 even in the case where the region b2 is narrow due to poor diffusion capability or in the case where the region b2 is invisible.

$C_{(f)}$ in the equation eq. 14 is equivalent to the coefficient of –i in the second term on the right side of the equation eq. 13 (corresponding to the gradient of the straight line region), and thus expressed as an equation eq. 16 illustrated in FIG. 25. Obtaining an equation eq. 17 illustrated in FIG. 25 by modifying the equation eq. 16 also allows estimating the diffusion limited current ($i_L$) as the characteristic value ($i_{L(f)}$) with the frequency information. As described above, expressing the differential value of the Tafel plot (the Tafel slope) as the current-Tafel slope characteristic and finding the plateau and the region proportionate to current allows easily separating the region b1, the region b2, and the diffusion region from one another. Additionally, this also allows obtaining a diffusion-influence starting current.

Calculating the evaluation parameter of the diffusion capability with the frequency information independent from current allows discussing diffusion capability, which has been conventionally difficult to evaluate, from a wider perspective. The diffusion limited current can be estimated to be a characteristic value with the frequency information, and thus may be used as new information when an optimized operation is controlled.

Additionally, use of the evaluation parameter of the diffusion capability allows diffusion correction of the normalized impedance. This allows separating the normalized impedance from each reaction process (region) even in an electrode reaction where the region b2 is small due to poor diffusion capability or the region b2 is invisible.

Furthermore, this allows calculation of the evaluation parameter of the diffusion capability and diffusion correction of the normalized impedance in an electrode reaction where a reaction that follows the Tafel equation and an influence of the diffusion are mixed. This can be widely used not only in evaluation of a fuel cell, but also in an electrode reaction other than the oxygen reduction reaction of a solution system and similar matter.

As described above, with the evaluation method according to the above-described embodiment, the catalyst surface is clean and the potential history is cancelled for potential control at a sweep rate determined based on sweep rate dependence of the LSV after the fast potential sweep. This allows catalyst activity evaluation (evaluation for a DC characteristic and an AC characteristic) where a catalytic active site is maximally utilized, errors due to a background influence is reduced, and reproducibility is high.

The DC current value during measurement is used to perform the normalization process for each measurement frequency in consideration of change in catalyst activation derived from temporal change in catalytic active site caused by surface adsorption of oxide, anion, organic matter, and similar matter during impedance measurement. This allows more accurately extracting only impedance derived from the catalytic reaction.

An electrode evaluation method of the disclosure is widely applicable to an electrode reaction system other than the oxygen reduction reaction insofar as the reaction is based on the Butler-Volmer equation.

Figure 26:
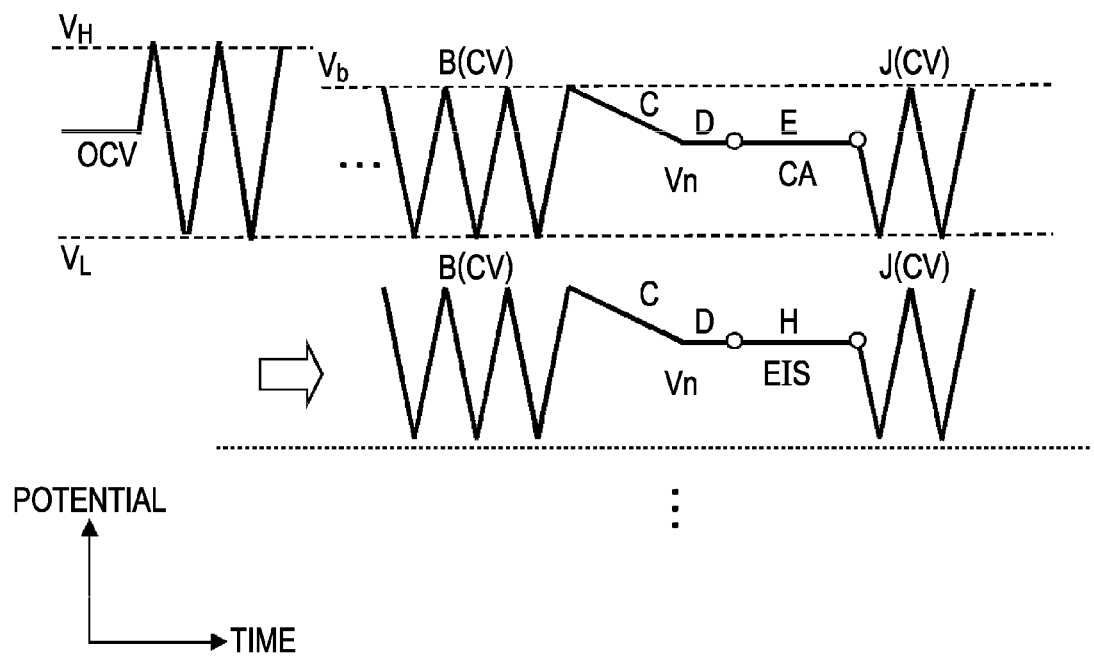
FIG. 26 is a diagram illustrating an example where a process for performing CV is inserted into the impedance measurement protocol illustrated in FIG. 6.

FIG. 26 is a diagram illustrating an example where a process for performing CV is inserted into the impedance measurement protocol illustrated in FIG. 6.

As illustrated in FIG. 26, a process "J" is inserted instead of the process "F" in the impedance measurement protocol illustrated in FIG. 6. This arranges CV in the process "B" and CV in the process "J" before and after CA in the process "E", and before and after EIS in the process "H". In view of this, comparing respective waveforms of the CV before and after CA or EIS allows capturing a peak intensity change or a peak potential change derived from an oxide or an organic matter. This allows determining how much and what kind of surface-adsorbed species are attached at a measurement potential.

As described above, the electrode evaluation apparatus according to the disclosure applies the temporal change in direct current value acquired by the current value acquiring unit to calculate the normalized impedance by multiplying the impedance, which is acquired by the impedance acquiring unit, by the direct current value. This allows acquiring the accurate normalized impedance.

The applicable scope of the disclosure is not limited to the aforementioned embodiments. The disclosure can be widely applied to an electrode evaluation apparatus and a similar apparatus that evaluate a characteristic of an electrode based on an electrochemical property.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An electrode evaluation apparatus for evaluating a characteristic of an electrode based on an electrochemical property, the electrode evaluation apparatus comprising:
    a potential control unit configured to control a potential applied to an electrode;
    an impedance acquiring unit configured to acquire an impedance characteristic of the electrode under a specific DC operating condition provided by the potential control unit;
    a current value acquiring unit configured to acquire a temporal change in direct current value under the specific DC operating condition; and
    a normalized impedance calculation unit configured to apply the temporal change in direct current value acquired by the current value acquiring unit to calculate a normalized impedance where impedance acquired by the impedance acquiring unit is multiplied by the direct current value.

2. The electrode evaluation apparatus according to claim 1, wherein
    the current value acquiring unit is configured to acquire the temporal change in direct current value based on controlled direct current from a potentiostat during chrono amperometry under the specific DC operating condition or during acquisition of the impedance characteristic by the impedance acquiring unit, the potentiostat being coupled to the electrode.

3. The electrode evaluation apparatus according to claim 1, wherein
    the potential control unit is configured to sequentially perform: a process of repeating a fast sweep prior to transition to the specific DC operating condition; a process of controlling a potential until satisfying the specific DC operating condition; and a process of maintaining a potential and waiting to release a background current.

4. The electrode evaluation apparatus according to claim 2, wherein
    the potential control unit is configured to sequentially perform: a process of repeating a fast sweep prior to transition to the specific DC operating condition; a process of controlling a potential until satisfying the specific DC operating condition; and a process of maintaining a potential and waiting to release a background current.

5. The electrode evaluation apparatus according to claim 1, further comprising
    a sweep rate determining unit configured to determine a sweep rate to reach the specific DC operating condition by performing measurement by linear sweep voltammetry for a plurality of sweep rates immediately after a fast sweep, wherein
    the potential control unit is configured to control a potential at the sweep rate determined by the sweep rate determining unit until the specific DC operating condition is satisfied.

6. The electrode evaluation apparatus according to claim 2, further comprising
    a sweep rate determining unit configured to determine a sweep rate to reach the specific DC operating condition by performing measurement by linear sweep voltammetry for a plurality of sweep rates immediately after a fast sweep, wherein
    the potential control unit is configured to control a potential at the sweep rate determined by the sweep rate determining unit until the specific DC operating condition is satisfied.

7. The electrode evaluation apparatus according to claim 3, further comprising
    a sweep rate determining unit configured to determine a sweep rate to reach the specific DC operating condition by performing measurement by linear sweep voltammetry for a plurality of sweep rates immediately after a fast sweep, wherein
    the potential control unit is configured to control a potential at the sweep rate determined by the sweep rate determining unit until the specific DC operating condition is satisfied.

8. The electrode evaluation apparatus according to claim 4, further comprising
    a sweep rate determining unit configured to determine a sweep rate to reach the specific DC operating condition by performing measurement by linear sweep voltammetry for a plurality of sweep rates immediately after a fast sweep, wherein
    the potential control unit is configured to control a potential at the sweep rate determined by the sweep rate determining unit until the specific DC operating condition is satisfied.

9. The electrode evaluation apparatus according to claim 5, wherein
    the sweep rate determining unit is configured to determine a slowest sweep rate to obtain a steady state among the plurality of sweep rates as the sweep rate to reach the specific DC operating condition.

10. The electrode evaluation apparatus according to claim 6, wherein
    the sweep rate determining unit is configured to determine a slowest sweep rate to obtain a steady state among the plurality of sweep rates as the sweep rate to reach the specific DC operating condition.

11. The electrode evaluation apparatus according to claim 7, wherein
the sweep rate determining unit is configured to determine a slowest sweep rate to obtain a steady state among the plurality of sweep rates as the sweep rate to reach the specific DC operating condition.

12. The electrode evaluation apparatus according to claim 8, wherein
the sweep rate determining unit is configured to determine a slowest sweep rate to obtain a steady state among the plurality of sweep rates as the sweep rate to reach the specific DC operating condition.

13. The electrode evaluation apparatus according to claim 1, further comprising
an evaluating unit configured to evaluate surface adsorption under the specific DC operating condition by performing cyclic voltammetry before and after the specific DC operating condition, and by comparing waveforms before and after the cyclic voltammetry.

14. The electrode evaluation apparatus according to claim 2, further comprising
an evaluating unit configured to evaluate surface adsorption under the specific DC operating condition by performing cyclic voltammetry before and after the specific DC operating condition, and by comparing waveforms before and after the cyclic voltammetry.

15. The electrode evaluation apparatus according to claim 3, further comprising
an evaluating unit configured to evaluate surface adsorption under the specific DC operating condition by performing cyclic voltammetry before and after the specific DC operating condition, and by comparing waveforms before and after the cyclic voltammetry.

16. The electrode evaluation apparatus according to claim 4, further comprising
an evaluating unit configured to evaluate surface adsorption under the specific DC operating condition by performing cyclic voltammetry before and after the specific DC operating condition, and by comparing waveforms before and after the cyclic voltammetry.

17. The electrode evaluation apparatus according to claim 5, further comprising
an evaluating unit configured to evaluate surface adsorption under the specific DC operating condition by performing cyclic voltammetry before and after the specific DC operating condition, and by comparing waveforms before and after the cyclic voltammetry.

18. The electrode evaluation apparatus according to claim 9, further comprising
an evaluating unit configured to evaluate surface adsorption under the specific DC operating condition by performing cyclic voltammetry before and after the specific DC operating condition, and by comparing waveforms before and after the cyclic voltammetry.

19. An electrode evaluation method for evaluating a characteristic of an electrode based on an electrochemical property, the electrode evaluation method comprising:
controlling a potential applied to an electrode;
acquiring an impedance characteristic of the electrode under a specific DC operating condition provided by the potential control;
acquiring a temporal change in direct current value under the specific DC operating condition; and
applying the acquired temporal change in direct current value to calculate a normalized impedance where the acquired impedance is multiplied by the direct current value.

* * * * *